United States Patent
Watanabe et al.

(10) Patent No.: US 7,094,652 B2
(45) Date of Patent: Aug. 22, 2006

(54) SEMICONDUCTOR DEVICE AND METHOD OF MANUFACTURING THE SAME

(75) Inventors: Hiroshi Watanabe, Yokohama (JP); Kiyomi Naruke, Sagamihara (JP); Kazunori Masuda, Yokkaichi (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/834,031

(22) Filed: Apr. 29, 2004

(65) Prior Publication Data

US 2004/0203207 A1 Oct. 14, 2004

Related U.S. Application Data

(62) Division of application No. 09/973,019, filed on Oct. 10, 2001, now Pat. No. 6,806,540.

(30) Foreign Application Priority Data

Oct. 11, 2000 (JP) ........................................ 2000-310155

(51) Int. Cl.
*H01L 21/8247* (2006.01)

(52) U.S. Cl. ........................ 438/286; 438/258; 438/305; 438/275

(58) Field of Classification Search ......... 438/257–267, 438/275, 286, 305
See application file for complete search history.

(56) References Cited

U.S. PATENT DOCUMENTS 4,651,406 A * 3/1987 Shimizu et al. ............. 438/275
5,188,976 A * 2/1993 Kume et al. ................. 438/258
5,254,866 A * 10/1993 Ogoh ........................... 257/369
5,278,441 A    1/1994 Kang et al.
5,904,518 A    5/1999 Komori et al.
6,365,472 B1 * 4/2002 Ishimaru et al. ............. 438/301

FOREIGN PATENT DOCUMENTS

| JP | 4-218925    | 8/1992  |
|----|-------------|---------|
| JP | 5-110003    | 4/1993  |
| JP | 8-78535     | 3/1996  |
| JP | 8-250602    | 9/1996  |
| JP | 10-178172   | 6/1998  |
| JP | 11-74372    | 3/1999  |
| JP | 11-354783   | 12/1999 |
| JP | 2000-200903 | 7/2000  |
| JP | 2-243926    | 9/2000  |
| JP | 2000-243926 | 9/2000  |

* cited by examiner

*Primary Examiner*—Richard A. Booth
(74) *Attorney, Agent, or Firm*—Oblon, Spivak, McClelland, Maier & Neustadt, P.C.

(57) ABSTRACT

Disclosed is a semiconductor device comprising a first transistor and a second transistor formed on a semiconductor substrate, wherein a gate side wall of the second transistor has a thickness equal to that of a gate side wall of the first transistor, wherein each of the first and second transistors has an inner low impurity diffusion region and an outer high impurity diffusion region, and wherein the size of the inner low impurity diffusion region of the second transistor along the surface of the semiconductor substrate is larger than that of the inner low impurity diffusion region of the first transistor.

11 Claims, 17 Drawing Sheets

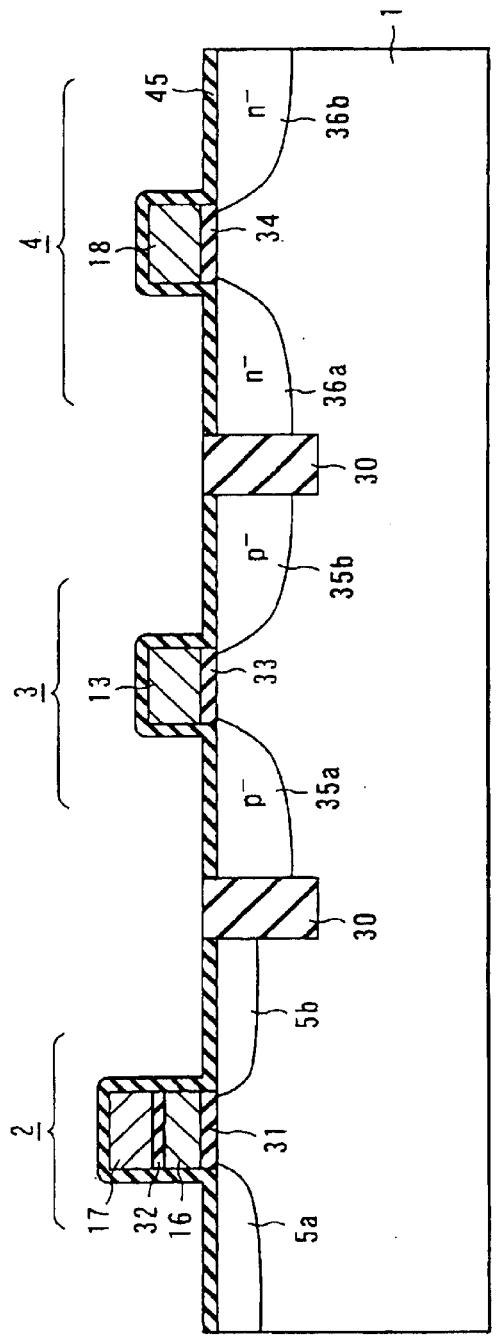
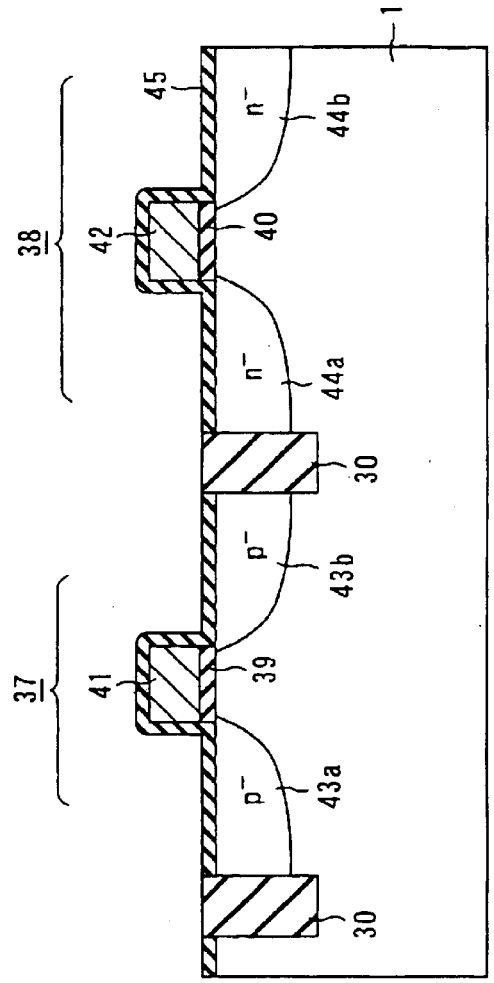
FIG. 4A
FIG. 4B

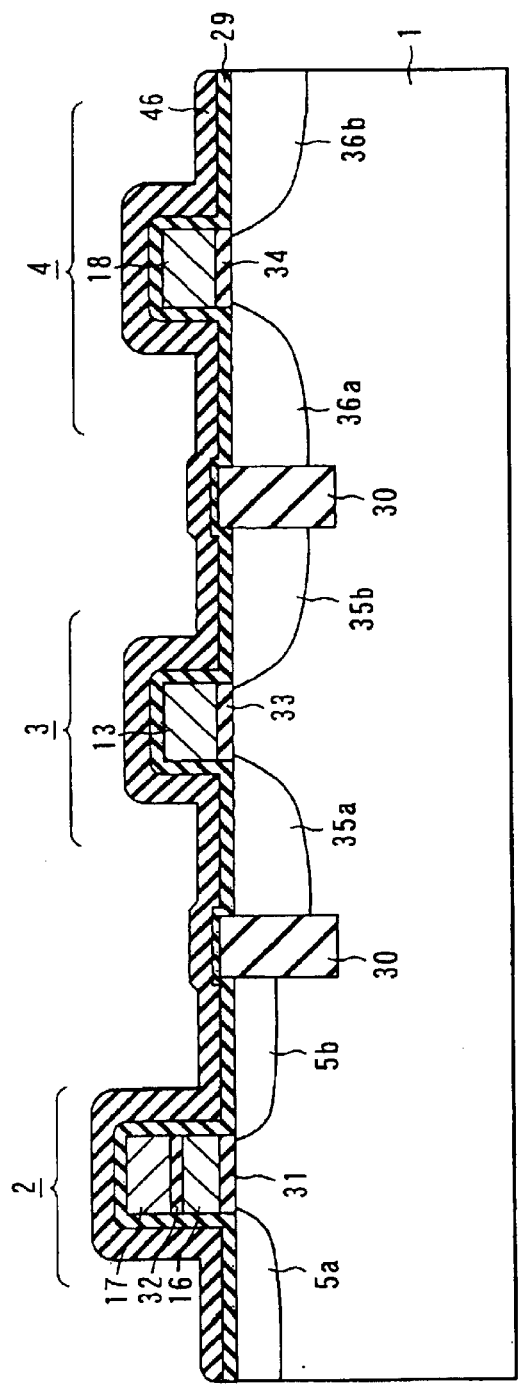
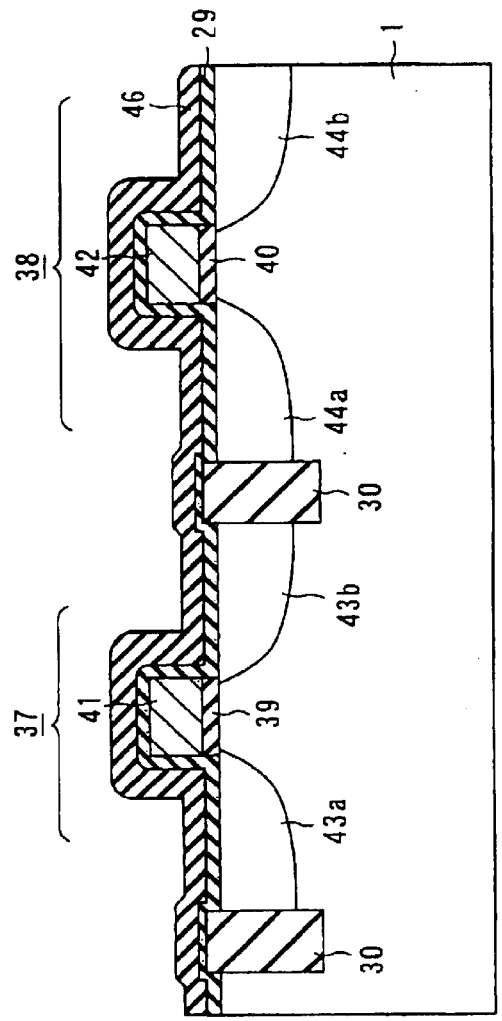
FIG. 5A
FIG. 5B

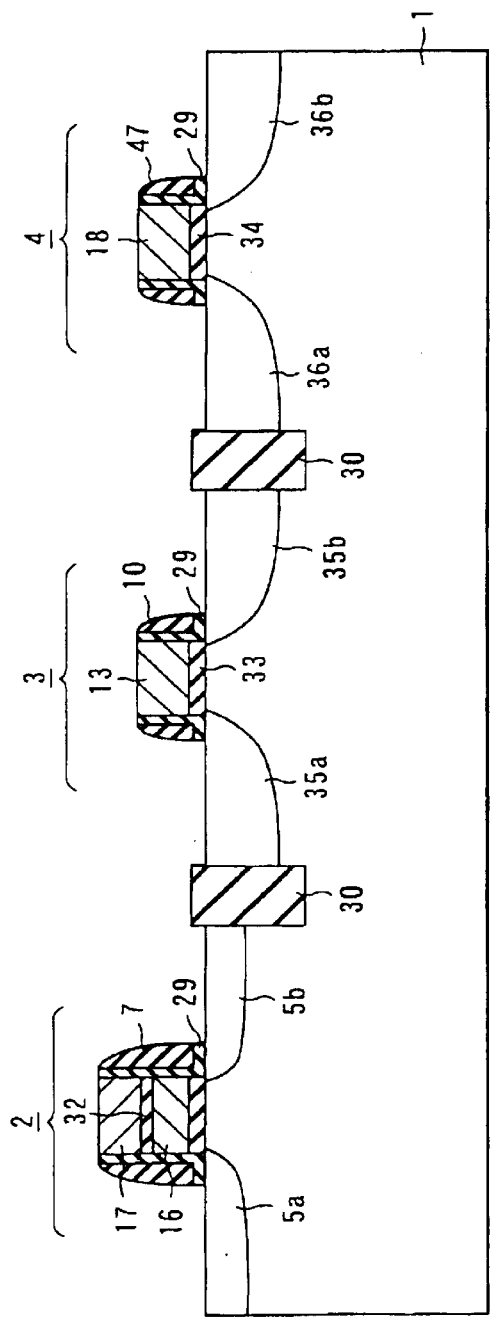
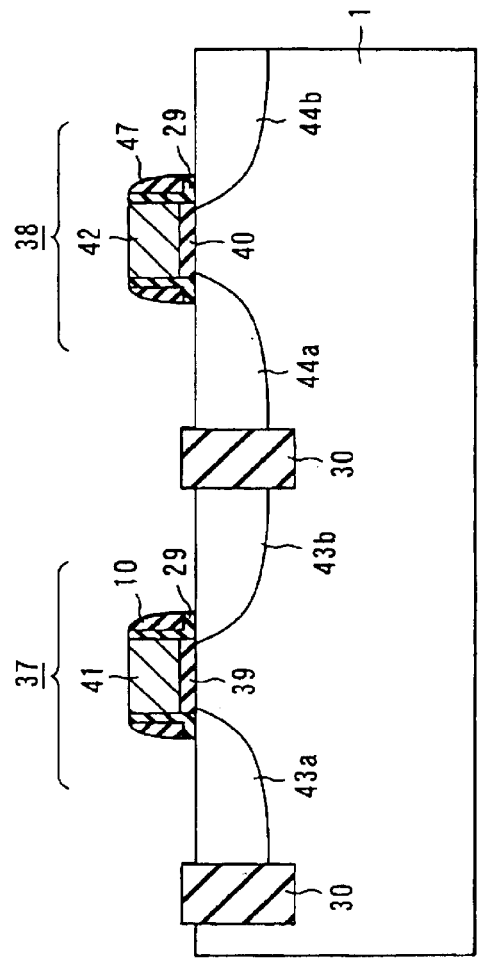
FIG. 6A
FIG. 6B

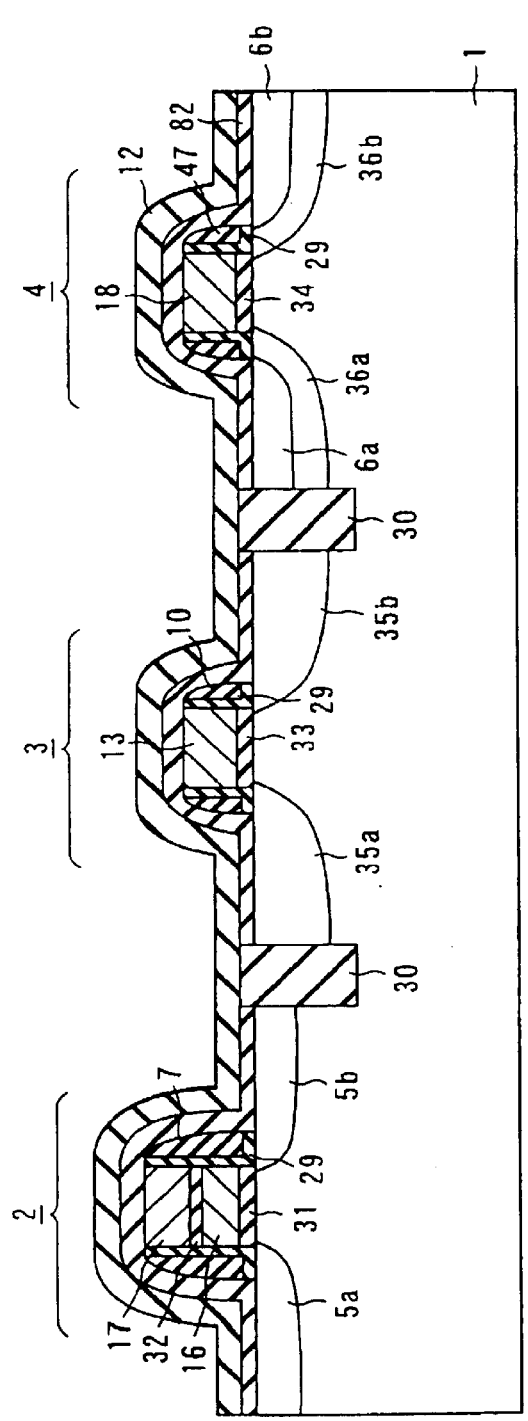
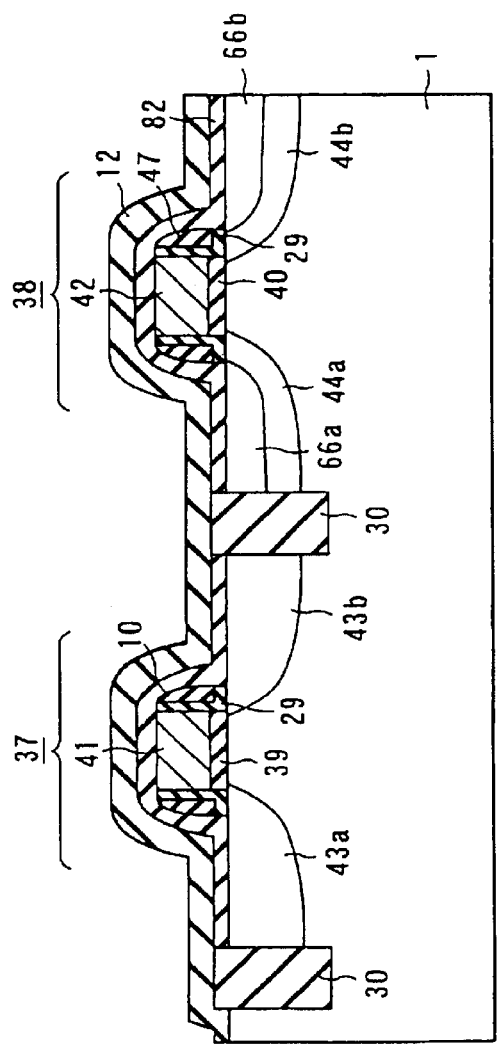
FIG. 7A
FIG. 7B

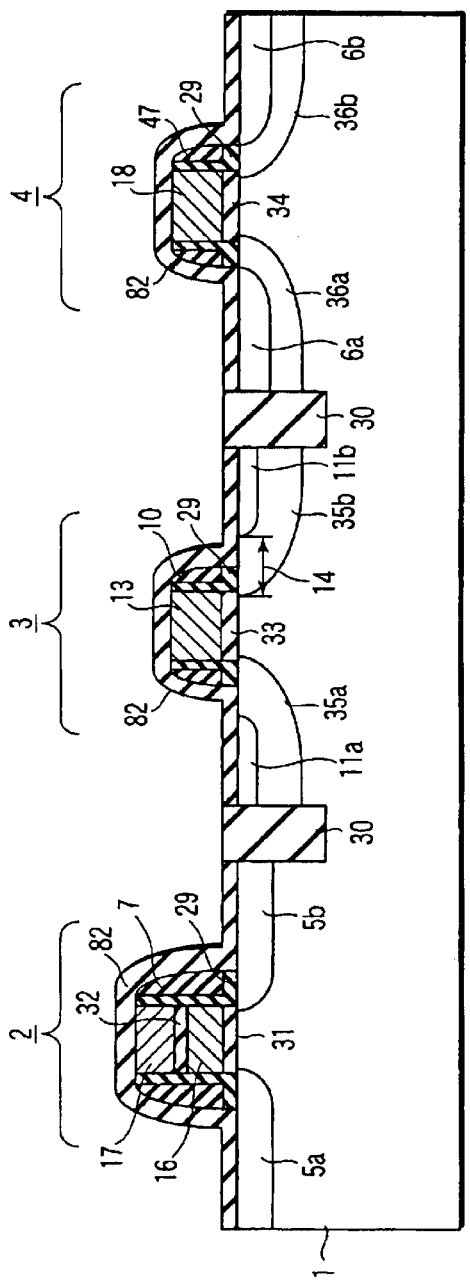
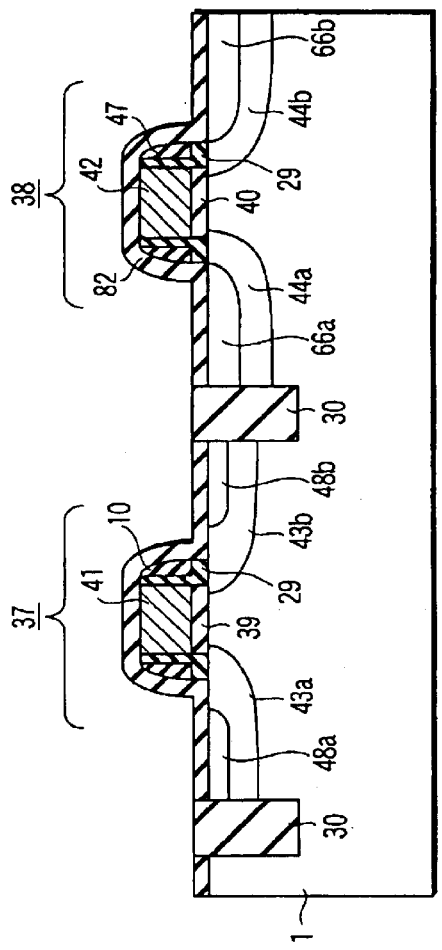
FIG. 9A
FIG. 9B

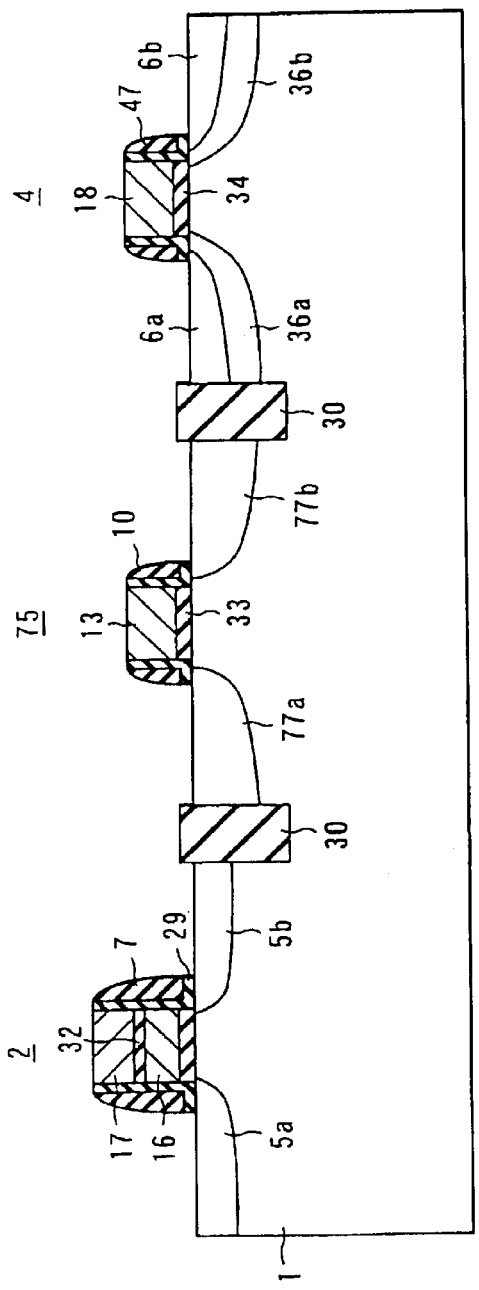
F I G. 17
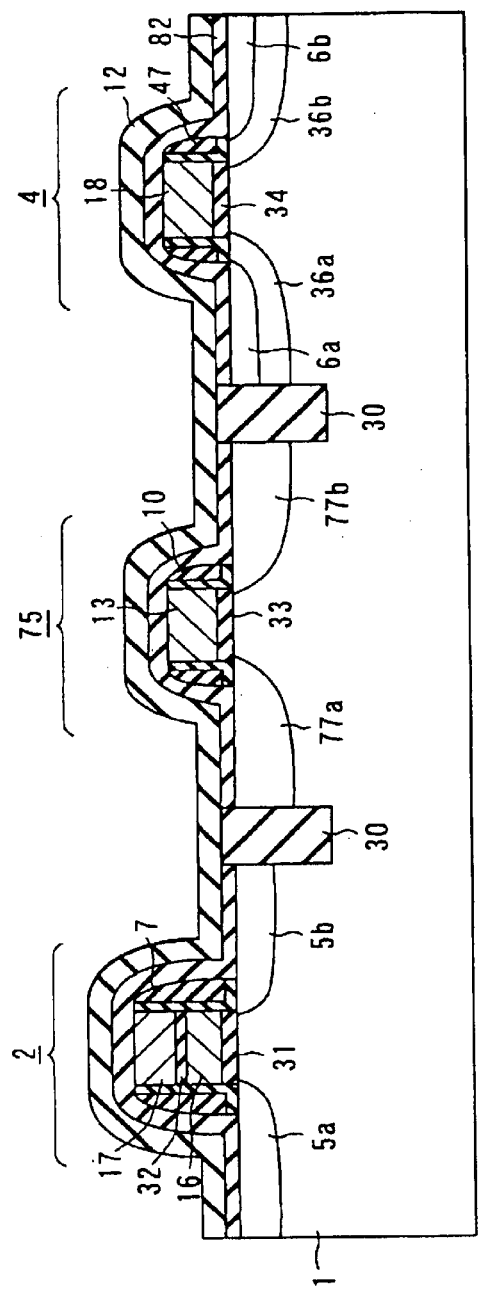
F I G. 18

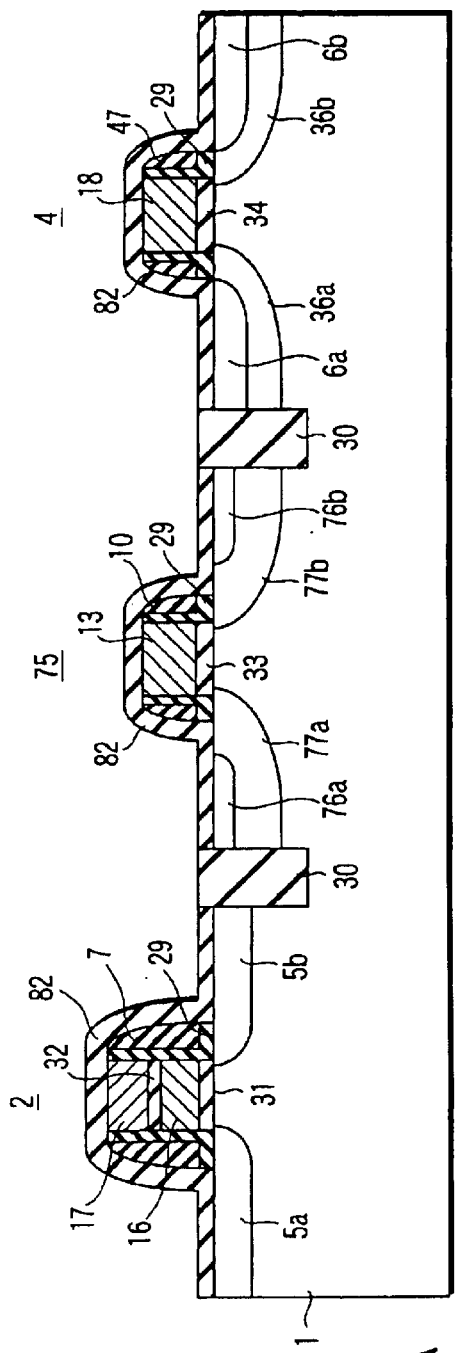
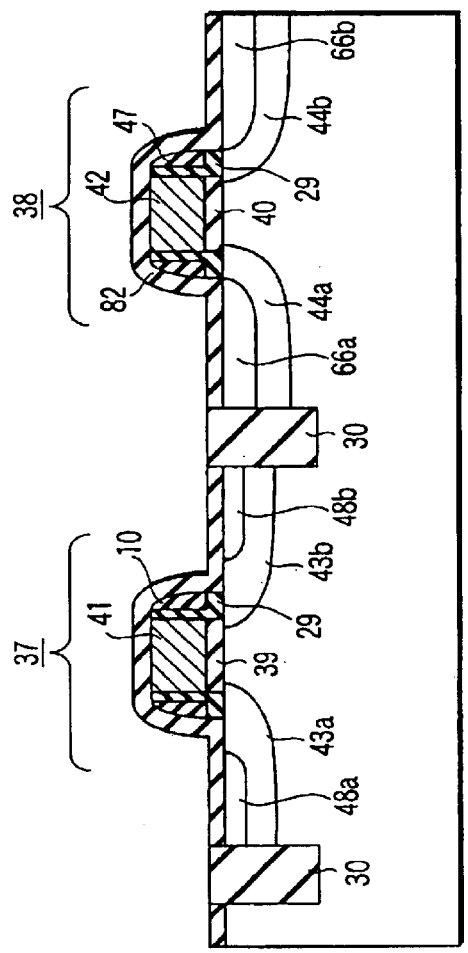
FIG. 20A
FIG. 20B

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2000-310155, filed Oct. 11, 2000, the entire contents of which are incorporated herein by reference.

BACKGROUND OF THE INVENTION

1. Field of the Invention

The present invention relates to a semiconductor device provided with a high voltage transistor, particularly, to a semiconductor device having a high degree of integration and a method of manufacturing the same.

2. Description of the Related Art

The construction of a conventional nonvolatile semiconductor memory device will now be described with reference to FIGS. 21 and 22. FIG. 21 is a cross sectional view showing the construction of the cell portion and the peripheral circuit portion of a NOR type flash memory.

As shown in FIG. 21, the NOR type flash memory comprises a high voltage transistor 203 used for writing, reading and erasing information in a memory cell 202 and a low voltage transistor 204 in addition to the memory cell 202 formed of a stacked transistor including a stacked gate structure having a floating gate 200 having a memory retaining capability and a control gate 201.

The memory cell 202 is constructed such that a gate structure is interposed between source/drain diffusion layers 214. The gate structure has a stacked gate structure including a tunnel oxide film 218 formed on a semiconductor substrate 223, the floating gate 200 formed on the tunnel oxide film 218, an interlayer insulating film 219 formed on the floating gate 200, and the control gate 201 formed on the interlayer insulating film 219. Further, a gate side wall 209b is formed in a manner to surround the stacked gate structure noted above. Incidentally, the memory cell 202 is separated from the memory peripheral element such as a high voltage transistor by a shallow trench isolation layer 221.

The high voltage transistor 203 is constructed such that a gate structure is interposed between two N⁻ type diffusion layers 206 formed in the surface region of the substrate 223. The gate structure noted above includes a thick gate oxide film 205 formed on the semiconductor substrate 223 and a gate electrode 211 formed on the gate oxide film 205. A gate side wall 209 equal in thickness to the gate side wall 209b of the memory cell 202 is formed to surround the gate structure, and the surface region of the N⁻ diffusion layer 206 is covered with the gate insulating film 205 and the gate side wall 209. Further, N⁺ diffusion layers 207 are formed to extend away from the gate structure on those portions of the surface of the substrate 223 which are positioned outside the N⁻ diffusion layers 206.

Further, the low voltage transistor 204 referred to previously is formed away from the high voltage transistor 203, with a shallow trench isolation layer 221 interposed therebetween. In the low voltage transistor 204, a gate electrode is formed between adjacent N⁻ diffusion layers 216. The gate structure comprises a thin gate oxide film 220 formed on the semiconductor substrate 223 and a gate electrode 212 formed on the gate oxide film 220. A side wall 209a equal in thickness to the memory cell 202 is formed to surround the gate structure of the transistor 204. Further, N⁺ diffusion layers 215 are formed to extend from the N⁻ diffusion layers 216 to the outside of the gate structure.

The high voltage transistor 203 is used for supplying a high voltage of ten and several volts to the memory cell 202 for the operation of, for example, writing and erasing information. In the high voltage transistor 203, the gate oxide film 205 has a large thickness, e.g., 20 nm, in order to prevent the gate oxide film 205 from being subjected to the insulation breakdown under a high voltage. In addition, it is necessary to set the junction breakdown voltage of the source/drain diffusion layers 206 and 207 at a high value of ten and several volts.

Under the circumstances, the diffusion layer 206 having a low concentration of N-type (P-type) impurity is formed deep. At the same time, a distance 208 (hereinafter referred to as an LDD length 208) of the tip of the diffusion layer 206 having a low concentration of the N-type (P-type) impurity, the tip being positioned below the gate insulating film 205 and the gate side wall 209, from the boundary between the diffusion layer 207 having a high concentration of an N-type (P-type) impurity and the diffusion layer 206 having a low impurity concentration noted above is set at a large value so as to facilitate the expansion of the depletion layer within the diffusion layer 206 having a low impurity concentration, thereby increasing the junction breakdown voltage.

Particularly, in the case of the high voltage transistor 203 is of a PMOS transistor, a P-type impurity of boron tends to be diffused into the semiconductor substrate 223 by the various heating steps employed in the process between the formation of the diffusion layers 206, 207 and the completion of the semiconductor device. Therefore, unless the thickness of the gate side wall 209 determining the LDD length 208 is maintained at a level not lower than a certain level, the LDD length 208 of the low impurity concentration region 206 positioned below the gate insulating film 205 and the gate side wall 209 is shortened or tends to be eliminated by the diffusion of boron from the high impurity concentration region 207 into the low impurity concentration region 206.

On the other hand, in a high voltage NMOS transistor (not shown), an N-type impurity of arsenic has a degree of diffusion in the heating step lower than that of the P-type impurity of boron so as to make it possible to form the gate side wall in a thickness smaller than that for the PMOS transistor 203.

However, in the conventional LDD structure shown in FIG. 21, the gate side wall 209 has a large thickness, e.g., 0.2 μm. The thickness of the gate side wall 209 is determined to conform with the PMOS transistor 203 requiring a high breakdown voltage. It follows that the gate side walls 209b and 209a of the memory 202 and the transistor 204 have thicknesses conforming with the high voltage PMOS transistor 203.

The ion implantation of a low concentration of a P-type impurity in the high voltage transistor 203 is performed after formation of the gate electrode 211, followed by forming the gate side wall 209. It is possible to set the LDD length 208 at a large value if the ion implantation of a P-type impurity is performed, after formation of the gate side wall 209, for forming the P⁺ diffusion layer 207 with the gate side wall 209 used as a mask. In the prior art, each of the side wall 209a of the low voltage transistor 204 and the side wall 209b of the memory cell 202 is formed in a large thickness of about 0.2 μm like the side wall of the high voltage transistor 203. What should be noted is that, in the prior art, the side walls 209b, 209 and 209a of the memory cell 202, and the transistors 203 and 204, respectively, are uniformly formed in the same thickness so as to decrease the number of process steps by forming simultaneously the side walls of the memory cell 202 and the transistors 203 and 204 in the same manufacturing process.

It should be noted that the distance between a contact hole 210 of the memory cell 202 and the gate electrode 201, the distance between a contact hole 210 of the transistor 203 and the gate electrode 203, and the distance between a contact hole 210 of the of the transistor 203 and the gate electrode 212 are equal to the sum of, for example, a side wall thickness 224 of the high voltage transistor 203 and an aligning allowance 225 between the side wall 209 and the contact hole 210. The aligning allowance is determined by the accuracy in the deviation of the alignment between the contact hole 210 and a gate electrode 211, the accuracy of the size in the contact hole 210 itself, and the accuracy of the size in the gate electrode 211 itself. This is also the case with the other memory cell 202 and the transistor 204.

Japanese Patent Application No. 11-46728 filed by the same assignee of the present application also discloses a semiconductor device relevant to the present application. This prior art will now be described with reference to FIG. 22. Incidentally, those portions of FIG. 22 which are equal to FIG. 21 are denoted by the same reference numerals so as to avoid an overlapping description.

In the prior art shown in FIG. 22, two kinds of the gate side wall structures are used for the memory cell and the transistors, including a thick gate side wall 112 used in the high voltage transistor 203 and a thin gate side wall 114 having a predetermined thickness 115, which is used in each of the memory cell 202 and the low voltage transistor 204. The first gate side wall 112 of the high voltage transistor 203 has a predetermined thickness 120 larger than the thickness 115 of the gate side wall 114 of the memory cell 202 and the low voltage transistor 204. Further, a second side wall 111 is formed in an upper portion of the first gate side wall 112.

In the case of employing the structure shown in FIG. 22, it is possible to ensure a sufficient LDD length 116, which permits obtaining the required junction breakdown voltage, in the high voltage transistor 203. It is also possible to use the side wall 114 thinner than that in the prior art shown in FIG. 21 in each of the memory cell 202 and the low voltage transistor 204. What should also be noted is that, since the LDD length 117 in the low voltage transistor 204 is smaller than the LDD length 116 of the high voltage transistor 203, it is possible to diminish the distance 119 between the gate electrode 212 and the contact hole 210.

The distance 119 is a sum of the side wall thickness 115 and the aligning allowance 225. In the high voltage transistor 203, the distance 118 between the gate electrode 211 and the contact hole 210 is equal to the sum of the side wall thickness 120 of the high voltage transistor 203 and the aligning allowance 225, which is larger than the distance 119 between the gates 200, 201, 212 and the contact hole 210 in the memory cell 202 and the low voltage transistor 204, respectively.

Further, FIG. 1 of Japanese Patent Disclosure (Kokai) No. 8-23031 discloses a semiconductor integrated circuit in which a double layer structure is employed in the gate side wall in order to increase the withstand voltage of the high voltage MOS transistor and to improve the driving capability of the low voltage MOS transistor. In this prior art, a diffusion layer of a high impurity concentration is formed with respect to the outer layer of the gate side wall having a double layer structure on the side of the high voltage MOS transistor, and a diffusion layer of a high impurity concentration is formed with respect to the inner layer of the gate side wall having a double layer structure on the side of the low voltage MOS transistor.

The method of manufacturing the conventional semiconductor device shown in FIG. 21 gives rise to the problem pointed out below.

Specifically, in forming the contact hole 210, there is a possibility for the contact hole 210 to be formed close to each of the gate electrodes 201, 211 and 212 because of the deviation in the mask alignment. There is also a possibility to bring about the inconvenience that the contact hole 210 is caused to deviate to cover partly the gate side walls 209a, 209 and 209a because of the enlargement in the size of these members. Where the material forming the gate side wall is unlikely to be etched, the bottom surface of the contact hole 210 fails to be brought into contact with the surface of the diffusion region formed in the surface region of the semiconductor substrate 223 as designed. Since the contact area between the bottom surface of the contact hole 210 and the surface of the substrate 223 is diminished, the contact resistance of the contact hole 210 is increased.

On the other hand, where the semiconductor device is designed such that a sufficient distance, e.g., 0.2 µm, is provided between the contact hole 210 and each of the gate side walls 209b, 209 and 209a so as to prevent the contact hole 210 from being brought into contact with any of the gate side walls 209b, 209, 209a, the distance between the contact hole 210 and each of the gate electrodes 201, 211 and 212 is rendered large, e.g., 0.4 µm, leading to an increase in the chip size.

Concerning the memory cell 202, the $N^+$ diffusion layers 214 are formed as the source/drain regions in a manner to overlap partly with the floating gate 200, with the result that the LDD side wall structure 209b is originally unnecessary. It should be noted in this connection that, in forming the LDD structure for the peripheral transistors during the manufacturing process of the semiconductor device, the gate side wall 209b is also formed simultaneously in the memory cell 202, with the result that the gate side wall is also present in the memory cell 202.

However, if the memory cell 202 is made finer so as to make smaller the distance between the adjacent word lines connected to the memory cells, the area of the bottom surface of the contact hole 210 is made very small or is eliminated completely by the thick gate side wall 209b so as to make it impossible to design the semiconductor device such that a contact is formed between the adjacent word lines. Such being the situation, in order to form a contact hole between the adjacent word lines, it is unavoidable to enlarge the cell size because the side wall is thick. This is a very serious problem inhibiting the miniaturization of the semiconductor device.

A serious problem also remains unsolved in the low voltage NMOS transistor 204 of the peripheral circuit. Specifically, since the side wall 209a is rendered thick, the LDD length 217 of the $N^-$ diffusion layer 216 is rendered long so as to increase the parasitic resistance, leading to the problem that the current driving capability of the transistor 204 is lowered.

Under the circumstances, since a high junction breakdown voltage is unnecessary in the low voltage transistor 204, the inconvenience is brought about that the circuit pattern is rendered large and the performance is deteriorated.

The prior art shown in FIG. 22 is capable of resolving the problem inherent in the prior art shown in FIG. 21. In the prior art shown in FIG. 22, however, the thick gate side wall 112 is formed in only the high voltage transistor 203 and, thus, the gate side walls 112 and 114 are formed separately by adding one or two photolithography steps to the prior art shown in FIG. 21. It follows that the gate side wall forming steps are rendered complex, leading to an increase in the number of manufacturing steps, compared with the prior art shown in FIG. 21.

BRIEF SUMMARY OF THE INVENTION

According to a first aspect of the present invention, there is provided a semiconductor device, comprising a first transistor including a first gate formed on a semiconductor substrate, a first diffusion layer of a low impurity concentration formed on the surface of the semiconductor substrate in a manner to surround the first gate, a first diffusion layer of a high impurity concentration formed on the surface of the semiconductor substrate in a manner to surround the first diffusion layer having a low impurity concentration, and a first gate side wall formed to surround the first gate; and a second transistor including a second gate formed on the semiconductor substrate, a second diffusion layer of a low impurity concentration formed on the surface of the semiconductor substrate in a manner to surround the second gate, a second diffusion layer of a high impurity concentration formed on the surface of the semiconductor substrate in a manner to surround the second diffusion layer having a low impurity concentration, and a second gate side wall formed to surround the second gate and having a thickness equal to that of the first gate side wall of the first transistor; wherein the size of the second diffusion layer formed on the surface of the semiconductor substrate and having a low impurity concentration, which extends from the second gate to reach the second diffusion layer having a high impurity concentration, is larger than the size of the first diffusion layer formed on the surface of the semiconductor substrate and having a low impurity concentration, which extends from the second gate to reach the first diffusion layer having a high impurity concentration.

According to another aspect of the present invention, there is provided a method of manufacturing a semiconductor device, comprising forming the gate of a first transistor and the gate of a second transistor on a semiconductor substrate; forming a first diffusion layer having a low impurity concentration in the semiconductor substrate with the gate of the first transistor used as a mask; forming a second diffusion layer having a low impurity concentration in the semiconductor substrate with the gate of the second transistor used as a mask; forming gate side walls of the same thickness to surround the gates of the first transistor and the second transistor, respectively; forming a first diffusion layer having a high impurity concentration, which is positioned adjacent to the first diffusion layer having a low impurity concentration, within the semiconductor substrate, with the gate side wall of the first transistor used as a mask; forming a mask side wall on the gate side wall of the second transistor; forming a second diffusion layer having a high impurity concentration, which is positioned adjacent to the second diffusion layer having a low impurity concentration, within the semiconductor substrate, with the mask side wall used as a mask; and removing the mask side wall.

BRIEF DESCRIPTION OF THE SEVERAL VIEWS OF THE DRAWING

FIG. 4A is a cross sectional view showing the step for explaining the manufacturing method of the main construction of the semiconductor device according to the first embodiment of the present invention;

FIG. 4B is a cross sectional view showing the step for explaining the manufacturing method of the partial construction of the semiconductor device according to the first embodiment of the present invention;

FIG. 5A is a cross sectional view showing the step, which follows the step shown in FIG. 4A, for explaining the manufacturing method of the main construction of the semiconductor device according to the first embodiment of the present invention;

FIG. 5B is a cross sectional view showing the step, which follows the step shown in FIG. 4B, for explaining the manufacturing method of the partial construction of the semiconductor device according to the first embodiment of the present invention;

FIG. 6A is a cross sectional view showing the step, which follows the step shown in FIG. 5A, for explaining the manufacturing method of the main construction of the semiconductor device according to the first embodiment of the present invention;

FIG. 6B is a cross sectional view showing the step, which follows the step shown in FIG. 5B, for explaining the manufacturing method of the partial construction of the semiconductor device according to the first embodiment of the present invention;

FIG. 7A is a cross sectional view showing the step, which follows the step shown in FIG. 6A, for explaining the manufacturing method of the main construction of the semiconductor device according to the first embodiment of the present invention;

FIG. 7B is a cross sectional view showing the step, which follows the step shown in FIG. 6B, for explaining the manufacturing method of the partial construction of the semiconductor device according to the first embodiment of the present invention;

FIG. 9A is a cross sectional view showing the step, which follows the step shown in FIG. 8A, for explaining the manufacturing method of the main construction of the semiconductor device according to the first embodiment of the present invention;

FIG. 9B is a cross sectional view showing the step, which follows the step shown in FIG. 8B, for explaining the manufacturing method of the partial construction of the semiconductor device according to the first embodiment of the present invention;

FIG. 17 is a cross sectional view showing one step, which follows the step shown in FIG. 16, of the manufacturing method of the main construction of the semiconductor device according to the second embodiment of the present invention;

FIG. 18 is a cross sectional view showing one step, which follows the step shown in FIG. 17, of the manufacturing method of the main construction of the semiconductor device according to the second embodiment of the present invention;

FIG. 20A is a cross sectional view showing one step, which follows the step shown in FIG. 19, of the manufacturing method of the main construction of the semiconductor device according to the second embodiment of the present invention;

FIG. 20B is a cross sectional view showing the step, which follows the step shown in FIG. 19 and corresponds to the step shown in FIG. 9B, for explaining the manufacturing method of the partial construction of the semiconductor device according to the second embodiment of the present invention;

DETAILED DESCRIPTION OF THE INVENTION

Figure 1:
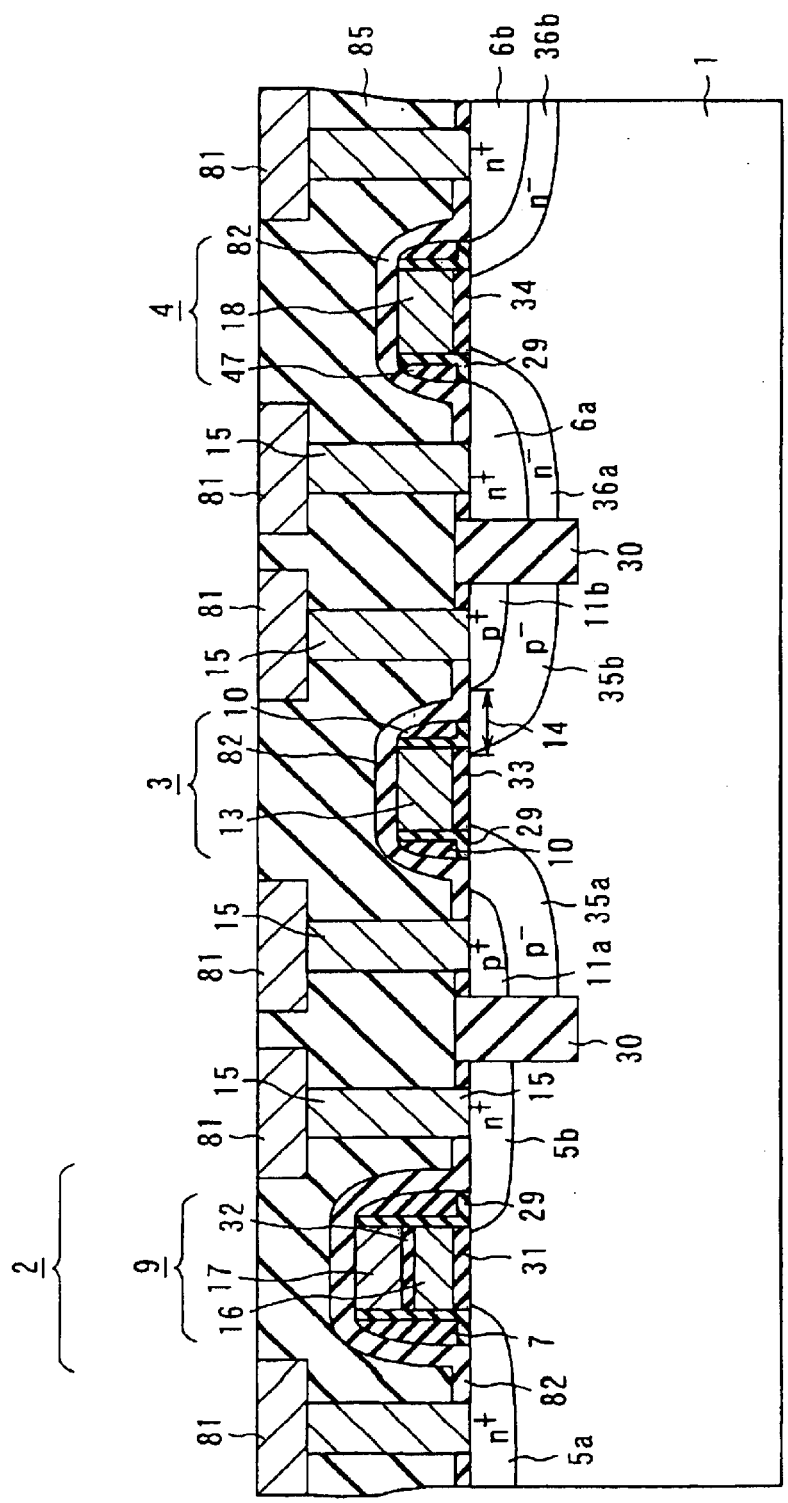
FIG. 1 is a cross sectional view showing the main construction of a semiconductor device according to a first embodiment of the present invention.

Some embodiments of the present invention will now be described with reference to the accompanying drawings. Throughout the drawings, the same or similar members of the semiconductor devices are denoted by the same or similar reference numerals so as to avoid an overlapping description. It should be noted that the drawings schematically depict the construction of the semiconductor devices and, thus, the relationship between the thickness and the planar size, the ratio in thickness of the various layers, etc. shown in the accompanying drawings differ from those in the actual semiconductor devices. It follows that the specific thickness and size should be constructed in view of the following description. Also, the drawings include portions where the sizes and the ratios differ from each other.

(First Embodiment)

A semiconductor device according to a first embodiment of the present invention will now be described with reference to the cross sectional view shown in FIG. 1. The embodiment shown in FIG. 1 is directed to a NOR type flash memory.

In FIG. 1, a silicon nitride film 7, 10, 47 having a thickness of, for example, 80 nm is formed as a thin first side wall in a memory cell transistor 2, a high voltage PMOS transistor 3 and a high voltage NMOS transistor 4 formed in a semiconductor substrate 1, respectively. The expression "formed in the semiconductor substrate" includes the case where some region or layer is actually "formed in the well formed in the semiconductor substrate".

The memory cell transistor 2 shown in FIG. 1 includes a gate 9 sandwiched between $N^+$ diffusion layers 5a, 5b forming the source/drain regions. The gate 9 includes a tunnel oxide film 31 formed to bridge the $N^+$ diffusion layers 5a and 5b, a floating gate 16 formed on the tunnel oxide film 31, an interlayer insulating film 32 formed on the floating gate 16, and a control gate 17 formed on the interlayer insulating film 32. These gates 16 and 17 are formed by electrodes such as, for example, polysilicon films. Further, a silicon oxide film 29, a first side wall 7 and a second side wall 82 are formed to surround the gate 9. Incidentally, the memory cell transistor 2 is separated from the other elements by a shallow trench isolation layer 30.

The high voltage PMOS transistor 3 includes a gate sandwiched between $P^-$ diffusion layers 35a, 35b. The gate includes a thick gate oxide film 33 formed on the semiconductor substrate 1 in a manner to bridge the $P^-$ diffusion layers 35a and 35b and a gate electrode 13 formed on the gate oxide film 33. Also, the silicon oxide film 29, a first side wall 10 and the second side wall 82 are formed to surround the gate such that the sum of the thicknesses of the silicon oxide film 29, the first side wall 10 and the second side wall 82 is equal to the sum of the thicknesses of the side walls 29, 7 and 82 included in the memory cell transistor 2. Further, $P^+$ diffusion layers 11a and 11b are formed in upper and outer portions of the $P^-$ diffusion layers 35a and 35b, respectively, in surface regions of the substrate 1 apart from the gate 13.

The high voltage NMOS transistor 4 includes a gate sandwiched between $N^-$ diffusion layers 36a and 36b. The gate includes a thick gate oxide film 34 formed on the semiconductor substrate 1 in a manner to bridge the $N^-$ diffusion layers 36a and 36b and a gate electrode 18 formed on the gate oxide film 34. Also, the silicon oxide film 29, a first side wall 47 and the second side wall 82, which are equal in thickness to those in the memory cell transistor 2 and in the transistor 3, are formed to surround the gate 18. Further, $N^+$ diffusion layers 6a and 6b are formed in upper and outer portions of the $N^-$ diffusion layers 36a and 36b, respectively, apart on the surface of the substrate 1 from the gate 18.

The N⁺ regions 6a, 6b included in the high voltage NMOS transistor 4 are formed by implanting an N-type dopant with the silicon oxide film 29 and the first side wall 47 used as a mask in a self aligning manner. It should be noted that the dopant is thermally diffused from the boundary between the silicon oxide film 29 and the second side wall 82 into the N-regions 36a and 36b, with the result that the N⁺ diffusion regions 6a, 6b are formed to extend into those portions of the semiconductor substrate 1 which are positioned below the silicon oxide film 29 and the first side wall 47.

The N⁺ regions 5a, 5b included in the memory cell transistor 2 are formed by implanting an N-type dopant with the gate 9 used as a mask in a self aligning manner. It should be noted that the dopant is thermally diffused from the gate edge, i.e., from the edge portion of the tunnel oxide film 31, with the result that the N⁺ regions 5a, 5b are allowed to extend into regions inside the channel between the regions 5a and 5b.

The silicon oxide film 29, the first side wall 10 and the second side wall 82 of the high voltage PMOS transistor 3 shown in FIG. 1 is equal to those of the memory cell transistor 2 and the high voltage NMOS transistor 4 in construction and thickness. It should be noted, however, that the P⁺ diffusion layers 11a and 11b of the PMOS transistor 3 are formed by implanting a P-type dopant using the second side wall 82 and a third side wall (not shown in FIG. 1) formed during the manufacturing process of the semiconductor device as masks, with the result that the P⁺ diffusion layers 11a and 11b are formed remoter from the gate 13 than the N⁺ regions 6a and 6b formed in the NMOS transistor 4.

Figure 21:
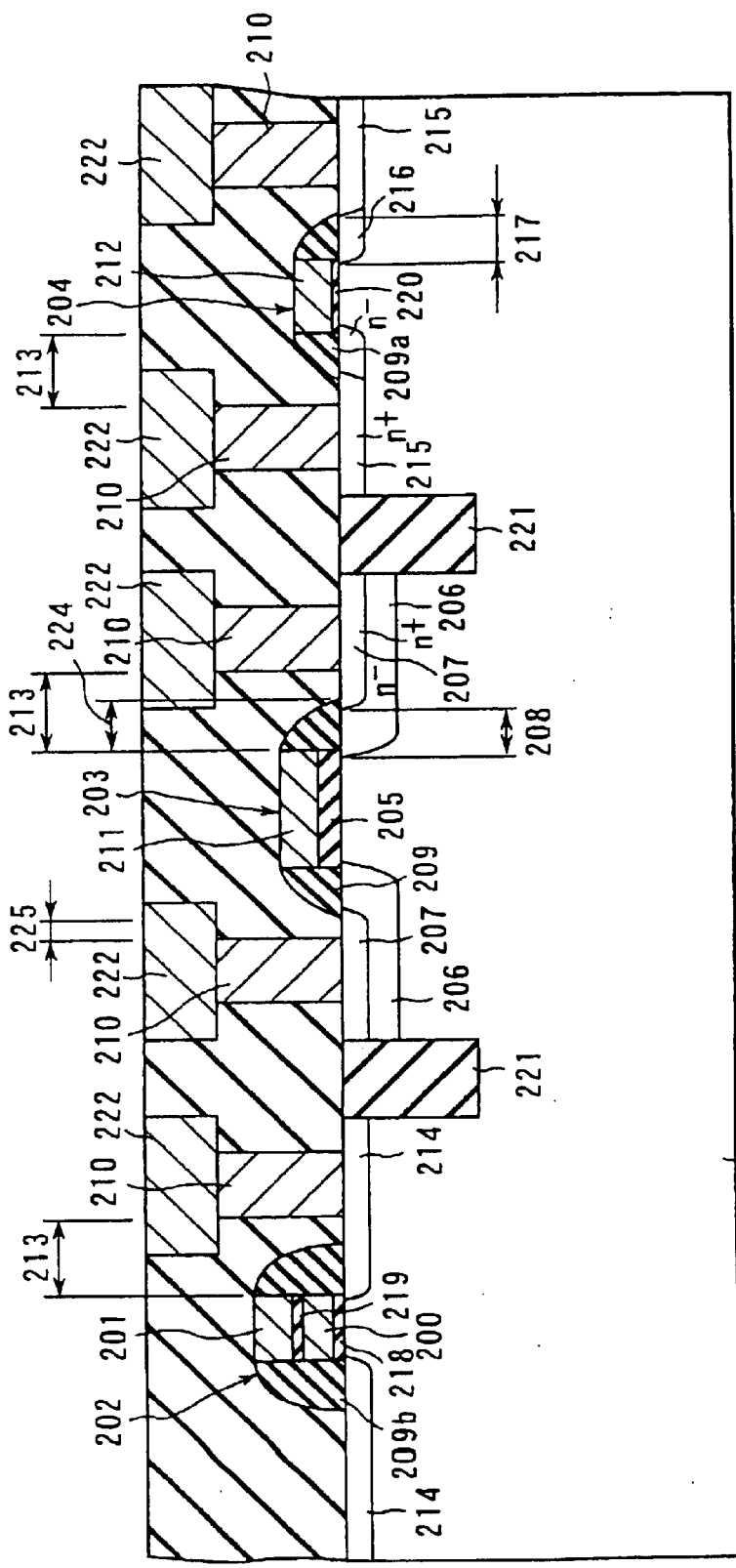
FIG. 21 is a cross sectional view showing an example of the construction of a conventional semiconductor device.
Figure 22:
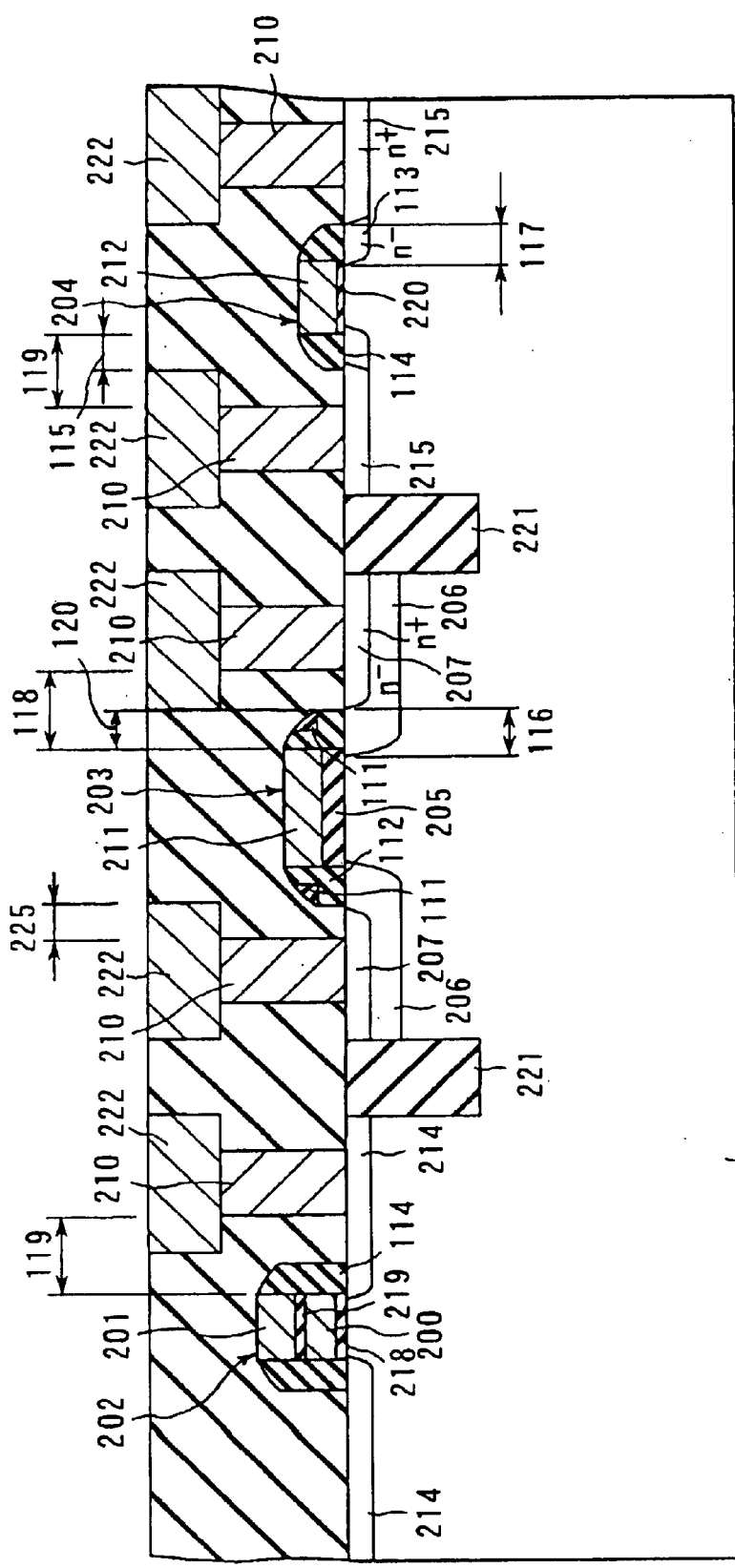
FIG. 22 is a cross sectional view showing another example of the construction of a conventional semiconductor device.

In the high voltage PMOS transistor 3, the edges of the P⁺ diffusion layers 11a and 11b are formed in positions corresponding to the edges of the outer surface of the second side wall 82 formed on the thin first side wall 10. What should be noted is that an LDD length 14 is rendered larger than that in the high voltage NMOS transistor 4. The first side wall 10 has a thickness of about 80 nm. On the other hand, the silicon oxide film 29 has a thickness of about 20 nm, and the second side wall 82 has a thickness of about 40 nm. It follows that the total thickness of the first side wall 10, the silicon oxide film 29 and the second side wall 82 is about 140 nm, which is smaller than the side wall thickness of 200 nm in the prior art shown in, for example, FIG. 21.

Such being the situation, it is also possible to make the distance between a contact hole 15 and the gate electrode 13 smaller than that in the prior art so as to make it possible to diminish the pattern area as in the low voltage NMOS transistor in the peripheral circuit and the memory cell transistor 2.

To be more specific, it is possible to reduce the area by ten and several percent so as to improve the degree of integration compared with the prior art, though the transistor 3 has a function conforming with a high voltage. Further, since the side wall thickness of the high voltage transistor 3 is decreased, the area of the diffusion layer exposed to the surface of the semiconductor substrate is not decreased even if the volume of the entire diffusion layer is diminished so as to make it possible to maintain a required area of the diffusion layer for contact between the diffusion layer and the wiring.

It should also be noted that, in the high voltage NMOS transistor 4, the region of the N⁻ diffusion layers 36a, 36b on the surface of the substrate 1, i.e., the LDD length, is shortened so as to decrease the parasitic resistance.

As described above, it is possible to form a transistor capable of withstanding a high voltage of, for example, 11V as the high voltage transistor.

It should be noted that, in the high voltage PMOS transistor 3, the P⁺ diffusion layers 11a, 11b are formed with the LDD length 14 left unchanged after formation of the P⁻ diffusion layers 35a, 35b forming the LDD region and, thus, the silicon oxide film 29, the first side wall 10 and the second side wall 82 used as a mask are collectively called an LDD side wall.

It should also be noted that, in the high voltage NMOS transistor 4, the N⁺ diffusion layers 6a, 6b are formed after formation of the N⁻ diffusion layers 36a, 36b forming the LDD region and, thus, the silicon oxide film 29 and the first side wall 47 used as a mask are collectively called an LDD side wall.

In the conventional semiconductor device, particularly, in the memory cell region, the distance between adjacent memory cell transistors was small, compared with the distance between adjacent transistors in the peripheral region, with the result that there was no allowance in space for forming a contact. In the first embodiment of the present invention, however, the thickness of the side walls of all the transistors are the same and rendered thin so as to make it possible to enlarge the space on the diffusion layer for forming a contact.

Figure 2:
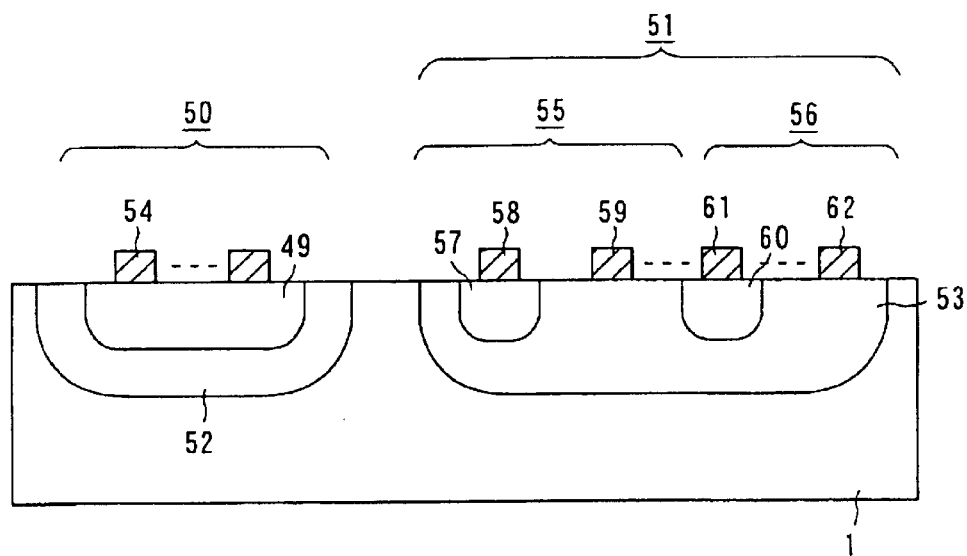
FIG. 2 is a cross sectional view schematically showing the entire construction of the semiconductor device according to the first embodiment of the present invention.

Practically, the memory cell region and the transistors in the peripheral region are formed as shown in FIG. 2 which shows a cross sectional view showing the arrangement of the memory cell region 50 and the peripheral transistor region 51. N-wells 52 and 53 are formed in the P-type semiconductor substrate 1 in a manner to correspond to the memory cell region 50 and the peripheral transistor region 51.

A P-well 49 is formed within the N-well region 52. Also, a plurality of memory cells 54 are formed within the P-well 49.

A high voltage transistor group 55 and a low voltage transistor group 56 are formed in the peripheral transistor region 51. The high voltage transistor group 55 includes a plurality of NMOS transistors (a single gate 58 alone being shown in FIG. 2) formed in a P-well 57 and a plurality of PMOS transistors (a single gate 59 alone being shown in the drawing) formed in the N-well 53.

The low voltage transistor group 56 includes a plurality of NMOS transistors 61 formed in the P-well 60 and a plurality of PMOS transistors (a single gate 62 alone being shown in the drawing) formed in the n-well 53.

Figure 3:
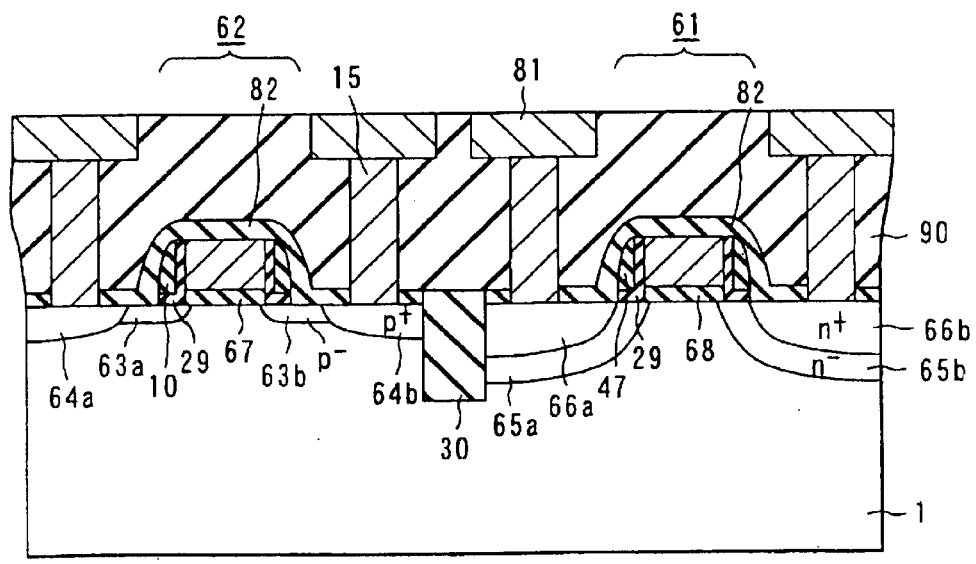
FIG. 3 is a cross sectional view showing the construction of a part of the semiconductor device according to the first embodiment of the present invention.

FIG. 3 is a cross sectional view showing the construction of the low voltage transistors. It should be noted that the low voltage PMOS transistor 62 and the low voltage NMOS transistor 61 are equal to the high voltage PMOS transistor and the high voltage NMOS transistor in the gate structure.

In the low voltage PMOS transistor 62, one edge of each of the P⁻ diffusion layer 63a, 63b is formed closer to that of the channel than a side wall 10, and the P⁺ diffusion layers 64a, 64b have edges formed outside the second side wall 82 that is positioned outside the side wall 10.

The gate oxide film 67 of the low voltage PMOS transistor 62 and the gate oxide film 68 of the low voltage NMOS transistor 61 are formed thinner than the gate oxide film 33 of the PMOS transistor 3 shown in FIG. 1 and the gate oxide film 34 of the high voltage NMOS transistor 4 shown in FIG. 1.

As to the high voltage transistor group 55, the explanation will be given by referring to the structure shown in FIG. 1. It should also be noted that the P⁻ diffusion layers 35a, 35b formed below the gate electrode 13, the silicon oxide film 29, the first side wall 10 and the second side wall 82 of the high voltage PMOS transistor 3 have an LDD length 14 extending from below the gate electrode 13 toward the P⁺ diffusion layers 11a, 11b. The LDD length 14 is formed longer than the N⁻ diffusion layers 36a, 36b formed below the gate electrode 18, the silicon oxide film 29, the first side wall 47 and the second side wall 82 of the high voltage NMOS transistor 4 and extending from below the gate 18 toward the N⁺ diffusion layers 6a, 6b. It should be noted that the gate oxide film 31 of the memory cell transistor 2 is substantially equal in thickness to the gate oxide films 67, 68 of the low voltage transistors 61, 62.

In the high voltage PMOS transistor 3, the diffusion rate of the boron ions constituting the P-type impurity is higher than the diffusion rate of the arsenic ions constituting the N-type impurity. Therefore, where the LDD length 14 is formed to be small, a high concentration of the P-type impurity is diffused from the P⁺ diffusion layers 11a, 11b deep into the LDD regions 35a, 35b in the subsequent heating steps employed until the completion of the manufacturing process of the semiconductor device. It follows that the LDD length is rendered short so as to make it difficult to obtain a required breakdown voltage. In the first embodiment of the present invention, however, the P⁺ diffusion layers 11a, 11b are formed by using as a mask a third side wall formed outside the second side wall 82 as described herein later in detail, with the result that it is possible to ensure the LDD length sufficient for maintaining the breakdown withstand voltage.

The third side wall is removed after formation of the P⁺ diffusion layers 11a, 11b as will be described later. The space after removal of the third side wall can be used as a space for forming the contact hole 15. It follows that the contact hole 15 can be formed close to the gate electrode 13 so as to improve the degree of integration.

The manufacturing method of the semiconductor device according to the first embodiment of the present invention, which is shown in FIG. 1, will now be described with reference to FIGS. 4A to 9B.

In the first step, as shown in FIG. 4A, the tunnel oxide film 31, the floating gate 16, the interlayer insulating film 32 and the control gate 17 of the memory cell transistor 2 and the gate oxide film 33 of the high voltage PMOS transistor 3 are formed in those regions on the semiconductor substrate 1, which are isolated by element isolating regions 30. At the same time, the gate oxide film 34 of the high voltage NMOS transistor 4, the gate electrode 13 of the high voltage PMOS transistor 3, and the gate electrode 18 of the high voltage NMOS transistor 4 are formed, followed by performing a desired ion implantation into the surface region of the semiconductor substrate 1 in a self-aligned fashion with the gate electrodes 16 (17), 13 and 18 used as masks followed by diffusing the implanted impurity ions. As a result, formed are the source/drain regions 35a, 35b (P⁻ regions) of the high voltage PMOS transistor 3 and the source/drain regions 36a, 36b (N⁻ regions) of the high voltage NMOS transistor 4.

On the other hand, in the memory cell transistor 2, the N⁺ diffusion layers 5a, 5b are formed as the source/drain regions in the both sides of the control gate electrode 17. Needless to say, since it is impossible to implant the N-type dopant and the P-type dopant simultaneously, the region into which the dopant is implanted is distinguished by using a photoresist in the step of implanting each of the N-type and P-type impurity ions.

Further, as shown in FIG. 4B, a gate oxide film 39 of the low voltage PMOS transistor 37 and a gate oxide film 40 of the low voltage NMOS transistor 37 are formed in the next step, followed by forming a gate electrode 41 of the low voltage PMOS transistor 37 and a gate electrode 42 of the low voltage NMOS transistor 38 on the gate oxide films 39 and 40, respectively.

In the next step, desired impurity ions are implanted into the surface region of the semiconductor substrate 1 in a self-aligned fashion, with the gate electrodes 41 and 42 used as a mask, so as to form source/drain regions 43a, 43b (P⁻ regions) of the low voltage PMOS transistor 37 and source/drain regions 44a, 44b (N⁻ regions) of the low voltage NMOS transistor 38.

It should be noted that the source/drain regions 43a, 43b (P⁻ regions) of the low voltage PMOS transistor 37 are formed simultaneously with formation of the source/drain regions 35a, 35b (P⁻ regions) of the high voltage PMOS transistor 3 by the simultaneous ion implantation. Further, the source/drain regions 44a, 44b (N⁻ regions) of the low voltage NMOS transistor 38 are formed simultaneously with formation of the source/drain regions 36a, 36b (N⁻ regions) by the simultaneous ion implantation.

It should be noted that the gate oxide films 39, 40 of the low voltage PMOS transistor 37 and the low voltage NMOS transistor 38 are formed thinner than the gate oxide films 33, 34 of the high voltage PMOS transistor 3 and the high voltage NMOS transistor 4.

Then, a re-oxidation film 45 is formed in a thickness of about 10 nm on the surfaces of the gate electrode and the source/drain regions of each of the transistors.

In the next step, as shown in FIGS. 5A and 5B, an insulating film such as a silicon oxide film 29 is formed in a thickness of about 10 to 20 nm on the re-oxidation film 45. The silicon oxide film 29 thus formed is used as a stopper in processing the side wall of the gate. After formation of the silicon oxide film 29, a silicon nitride film 46 is deposited on the silicon oxide film 29 in a thickness of about 80 nm in order to form a first side wall. Incidentally, the silicon oxide film 29 shown in FIGS. 5A and 5B includes the re-oxidation film 45 referred to above in FIGS. 4A and 4B.

In the next step, as shown in FIGS. 6A and 6B, the silicon nitride film 46 is selectively etched by an anisotropic etching so as to leave partly the silicon nitride film 46 on the side surface alone of each of the gate electrodes 18 and 42, thereby forming first side walls 47 of the same thickness.

Then, a high concentration of N-type impurity ions are implanted in the high voltage NMOS transistor 4 over the first side wall 47 so as to form N⁺ diffusion layers 6a, 6b, as shown in FIG. 7A. In this step, the portions of the PMOS transistor 3 and the memory cell 2 are covered with a photoresist (not shown) so as to prevent the impurity ions from being implanted into the PMOS transistor portion 3 and the memory cell portion 2.

In the step of forming the N⁺ diffusion layers 6a, 6b, a high concentration of N-type impurity ions are implanted in the part of the low voltage NMOS transistor 38 over the first side wall 47 so as to form N⁺ diffusion layers 66a, 66b, as shown in FIG. 7B. In this case, the area of the low voltage PMOS transistor 37 is covered with a photoresist (not shown) so as to prevent the impurity ions from being implanted into the low voltage PMOS transistor 37 area. In other words, the N⁺ diffusion layers 66a, 66b of the low voltage NMOS transistor 38 are formed simultaneously with formation of the N⁺ diffusion layers 6a, 6b of the high voltage NMOS transistor 4.

In the next step, a silicon nitride film 82 is formed on the entire surface of the substrate 1 in a thickness of, for example, 40 nm. The silicon nitride film 82 acts as a stopper in the subsequent step of processing the contact holes and also acts as the second side wall in the subsequent step of implanting a high concentration of P-type impurity ions.

Further, a silicon oxide film 12 forming a third side wall is deposited on the entire surface in a thickness of about 50 nm.

Figure 8A:
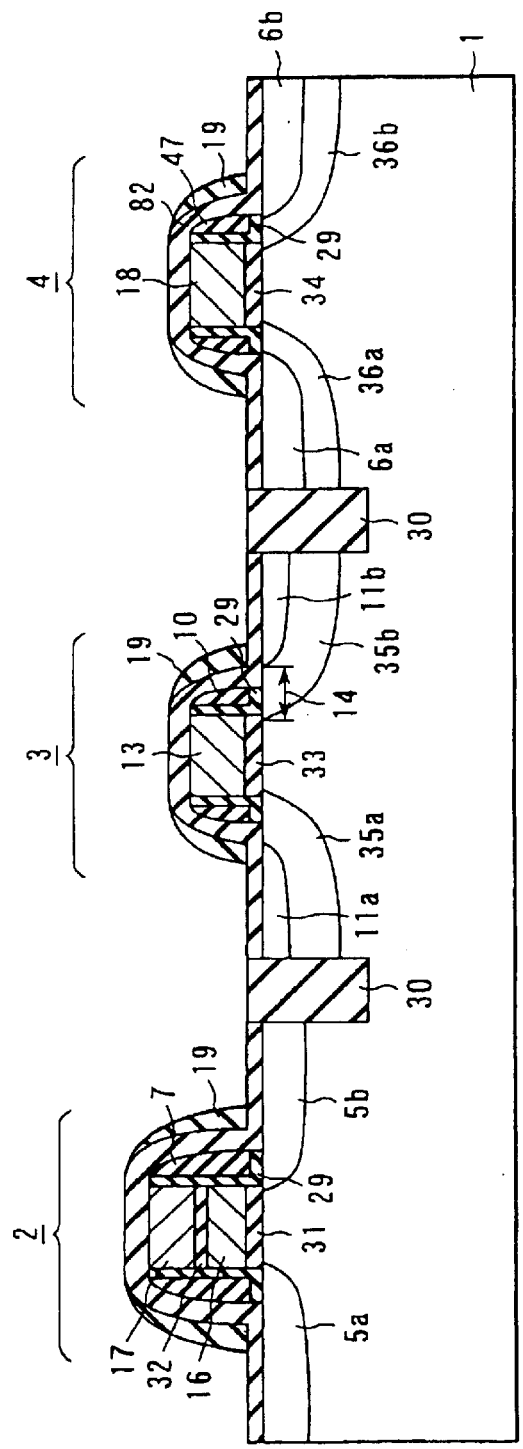
FIG. 8A is a cross sectional view showing the step, which follows the step shown in FIG. 7A, for explaining the manufacturing method of the main construction of the semiconductor device according to the first embodiment of the present invention.
Figure 8B:
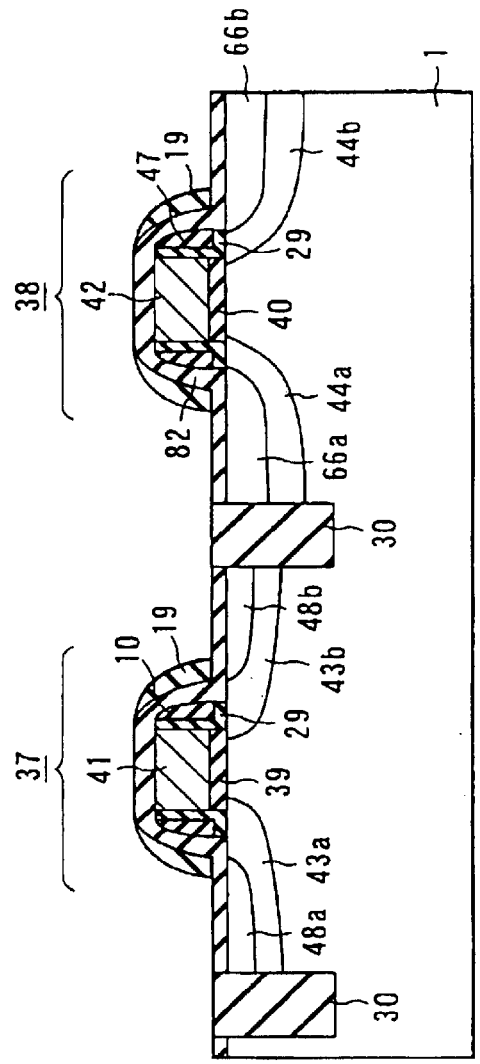
FIG. 8B is a cross sectional view showing the step, which follows the step shown in FIG. 7B, for explaining the manufacturing method of the partial construction of the semiconductor device according to the first embodiment of the present invention.

In the next step, an anisotropic etching capable of ensuring a high selectivity ratio relative to the silicon nitride film 82 is applied to the entire surface of the silicon oxide film 12 so as to leave partly, as the side wall, the silicon oxide film 12 unremoved, thereby forming the third side wall 19 on the transistors 2, 3, 4, 37 and 38, as shown in FIGS. 8A and 8B. In this case, the sum in thickness of the silicon nitride film 82 and the third side wall 19 formed of the remaining silicon oxide film 12 is set to correspond to the LDD length 14 large enough to allow the high voltage PMOS transistor 3 to exhibit a sufficient junction breakdown withstand voltage.

Then, a high concentration of P-type impurity ions are implanted into the high voltage PMOS transistor 3 and the low voltage PMOS transistor 37 by using the third side wall 19 as a mask so as to form P$^+$ diffusion layers 11a, 11b and the P$^+$ diffusion layers 48a, 48b. In this case, the memory cell transistor 2, the high voltage NMOS transistor 4 and the low voltage NMOS transistor 38 are covered with a photoresist so as to prevent the P-type impurity ions from being implanted into the memory cell transistor 2, the high voltage NMOS transistor 4 and the low voltage NMOS transistor 38.

In the next step, the third side wall 19 formed of the silicon oxide film on the silicon nitride film 82 is removed by etching with, for example, ammonium fluoride, as shown in FIGS. 9A and 9B. As a result, the memory cell transistor 2, the high voltage PMOS transistor 3, the high voltage NMOS transistor 4, the low voltage PMOS transistor 37 and the low voltage NMOS transistor 38 are rendered equal to each other in thickness of the gate side wall consisting of the silicon nitride films 29, 10, and 47.

Further, as shown in FIG. 1, an interlayer insulating film 85 is formed on the entire surface of the substrate 1 by, for example, a CVD method, followed by forming contact holes leading to the source/drain diffusion layers of each of the transistors 2, 3 and 4 in the interlayer insulating film 85. A conductive material such as tungsten is buried in the contact holes thus formed so as to form contact plugs 15, and desired wiring layers 81 are connected to the contact plugs 15 so as to complete a NOR type flash memory including the memory cell transistor 2 and the transistors 3 and 4 constituting the peripheral circuit, as shown in FIG. 1.

In the manufacturing process shown in FIGS. 9A and 9B, the third side wall 19 is removed after formation of the P$^+$-type diffusion layers 11a, 11b, 48a and 48b of the PMOS transistors 3 and 37 by implantation of P-type impurity ions. However, it is possible for the third side wall 19 not to be removed in this step so as to be left unremoved. It should be noted in this connection that, if the third side wall 19 is formed of a material that does not have a selectivity ratio in the step of the contact etching, the third side wall 19 can be partially removed in the subsequent step of the contact etching. It is possible to diminish the distance between the contact hole and the gate electrode of each transistor in this case, too.

As described above, three kinds of the LDD side walls are formed in the first embodiment of the present invention. The third side wall 19 used as a mask in the implanting step of a high dose of impurity ions for ensuring the LDD length of the high voltage PMOS transistors 3 and 37 constitutes one of these three kinds of the LDD side walls. To be more specific, the P$^+$ diffusion layers 11a, 11b, 48a, 48b of the high voltage and low voltage PMOS transistors 3, 37 are formed by ion implantation from outside the third side wall 19 so as to increase the length (LDD length) of the P$^-$ diffusion layers 35a, 35b, 43a, 43b along the surface of the substrate 1, thereby increasing the junction breakdown withstand voltage. Also, in the NMOS transistors 4 and 38 of the NMOS regions, a high concentration of N-type impurity ions are implanted from outside the first side wall 47 so as to decrease the length (LDD length) of the diffusion layers 36a, 36b, 44a, 44b each having a low impurity concentration on the surface in the longitudinal direction of the channel, thereby preventing the parasitic resistance from being increased.

According to the first embodiment of the present invention, in the high voltage PMOS transistor 3 in which the gate side wall is of a triple layer structure in the manufacturing step, the LDD length 14 from the P$^+$ diffusion layers 11a, 11b to the tips of the P$^-$ diffusion layers 35a, 35 is larger than the LDD length of the high voltage NMOS transistor 4.

On the other hand, the distance between the gate electrodes 16, 17 of the memory cell transistor 2 and the contact plug 15 is made shorter because the sum in thickness of the side walls 29 and 7 is smaller than that in the prior art so as to make it possible to diminish the memory cell area.

It should also be noted that the portion of the N$^-$ diffusion layers 36a, 36b of the high voltage NMOS transistor 4 is made shorter than in the prior art because the sum in thickness of the same thin side walls 47 and 29 is small so as to suppress the parasitic resistance and to prevent the current driving capability from being lowered.

Further, the third side wall 19 can be formed by simply depositing a silicon oxide film, followed by etching the silicon oxide film such that the silicon oxide film remains partly unremoved on the gate side wall. What should be noted is that the lithography process employed in the prior art need not be employed for forming the third side wall 19 in the method of the embodiment of the present invention, thereby suppressing the increase in the number of process steps to a minimum level.

The material of the third side wall 19 is not limited to silicon oxide. It is possible to use any material for forming the third side wall 19 as far as the material exhibits a selectivity ratio relative to the material that should not be removed in the step of removing partly the side wall.

Incidentally, in the high voltage NMOS transistor 4, the second side wall 47 is not used as a mask in forming the diffusion layers 6a, 6a having a high impurity concentration. However, where an impurity other than arsenic is used for forming the diffusion layers 6a, 6b having a high impurity concentration, it is possible to use the second side wall 47 as a mask for forming the diffusion layers 6a, 6b, as in the high voltage PMOS transistor 3. In this case, it is possible to further increase the withstand voltage of the high voltage NMOS transistor 4 as in the high voltage PMOS transistor 3.

(First Modification of First Embodiment)

Figure 10:
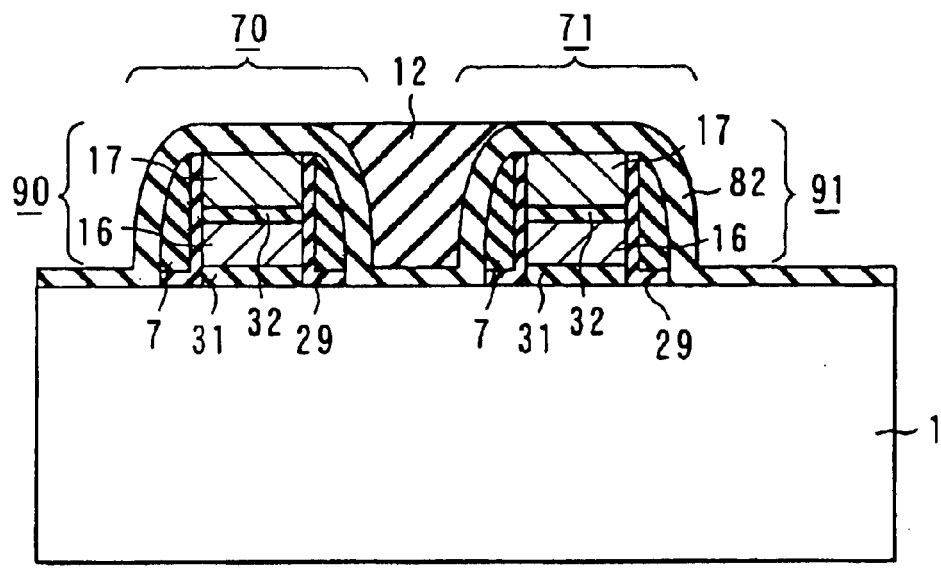
FIG. 10 is a cross sectional view showing one step of the manufacturing method of the semiconductor device according to a first modification of the first embodiment of the present invention.

As shown in FIG. 10, adjacent memory cell transistors 70 and 71 include gates 90 and 91, respectively, each including a stacked structure composed of the floating gate 16, the insulating film 32 and the control gate 17. It is possible for the distance between the gates 90 and 91 to be small and for the silicon oxide film 12 forming the third side wall to be buried completely in the clearance between the adjacent gates 90 and 91 of adjacent two memory cells.

Figure 11:
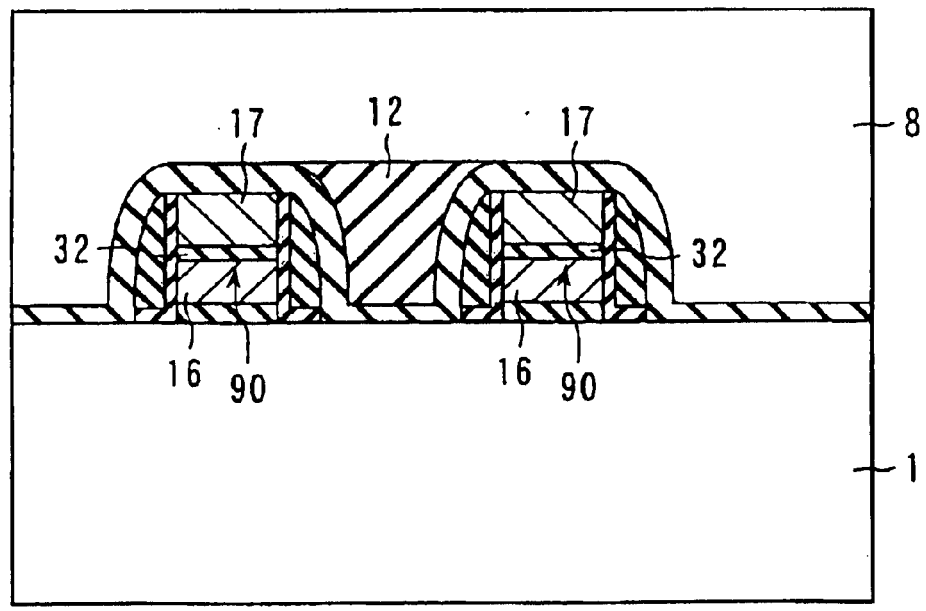
FIG. 11 is a cross sectional view showing the step, which follows the step shown in FIG. 10, of the manufacturing method of the semiconductor device according to the first modification of the first embodiment of the present invention.

In such a case, without removing the third side wall 19 formed of the silicon oxide film on the silicon nitride film 82 after the ion implantation for forming the P⁺ diffusion layers 11a, 11b in the step shown in FIG. 8A, a CVD insulating film 8 is deposited in a large thickness on the silicon oxide film 12, as shown in FIG. 11. In this case, the silicon oxide film 12 is buried completely between the gates 90 and 91 and, thus, void is not formed in the silicon oxide film 12. Therefore, in the subsequent contact hole opening step, the etching is performed in only the portion required for the contact. It should be noted that the oxide film 12 used as the side wall is well buried in the clearance between the adjacent gates since the clearance between the adjacent gates is small in the memory cell portion. It follows that there is no inconvenience in the burying properties of the CVD insulating film deposited in the subsequent step on the gate electrode of the memory cell portion.

It should also be noted that, since each of the side wall 12 and the CVD insulating film 8 is formed of a silicon oxide film, it is possible to carry out RIE under the same conditions in the subsequent step of the contact forming RIE process.

Second Modification of First Embodiment

The first embodiment shown in FIG. 1 covers the case where the gate electrodes 13 and 18 of the high voltage PMOS transistor 3 and the high voltage NMOS transistor 4 are formed lower than the gate electrode section 9 of a stacked structure of the layers 16 and 17, of the memory cell 2.

Figure 12:
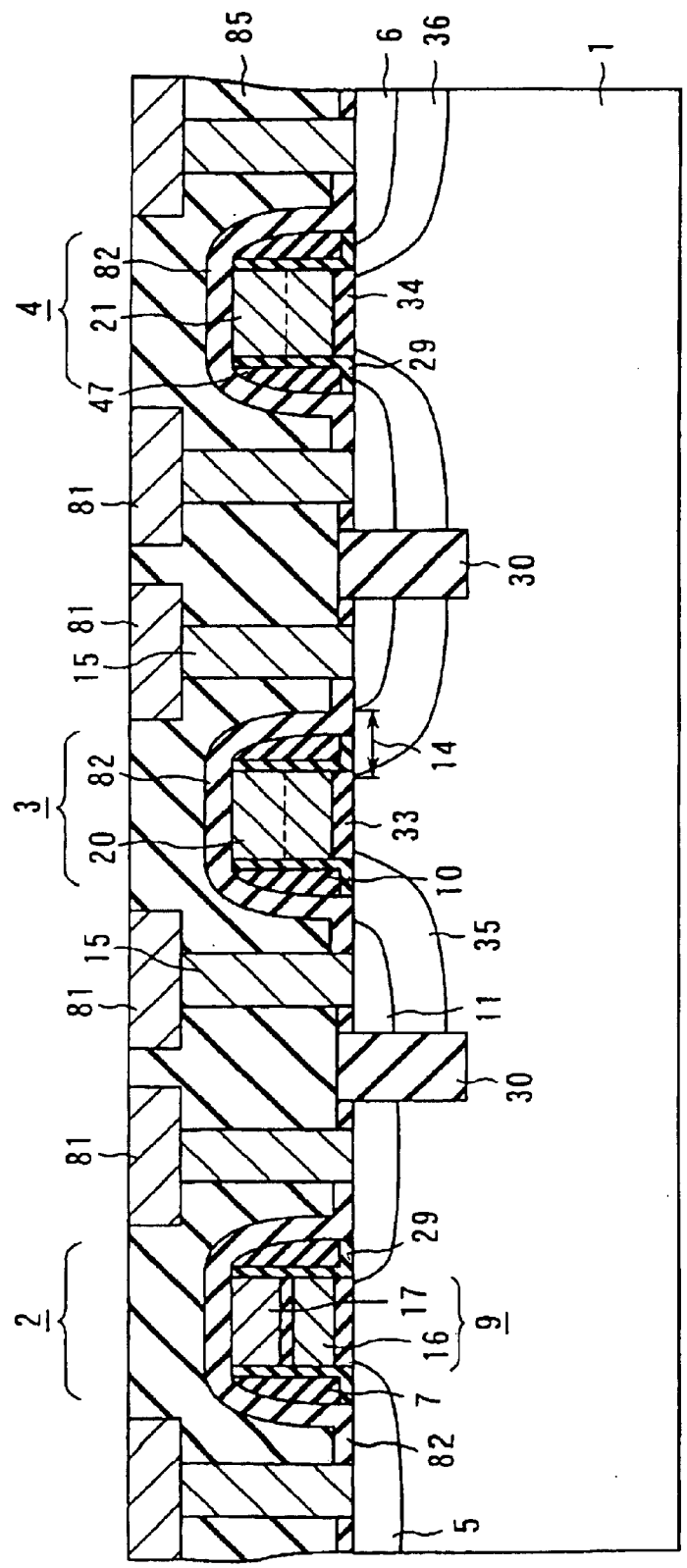
FIG. 12 is a cross sectional view showing the main construction of the semiconductor device according to a second modification of the first embodiment of the present invention.

However, it is possible to allow the height of the gate electrode 20 of the high voltage PMOS transistor 3 and the gate electrode 21 of the high voltage NMOS transistor 4 to be substantially equal to the height of the gate electrode portion 9 of the memory cell 2, as shown in FIG. 12. In this case, the polysilicon layer corresponding to the floating gate 16 and the polysilicon layer corresponding to the control gate 17 are stacked one upon the other without forming the insulating film interposed between the two polysilicon layers except the gate 9 of the memory cell transistor 2.

(Second Embodiment)

Figure 13:
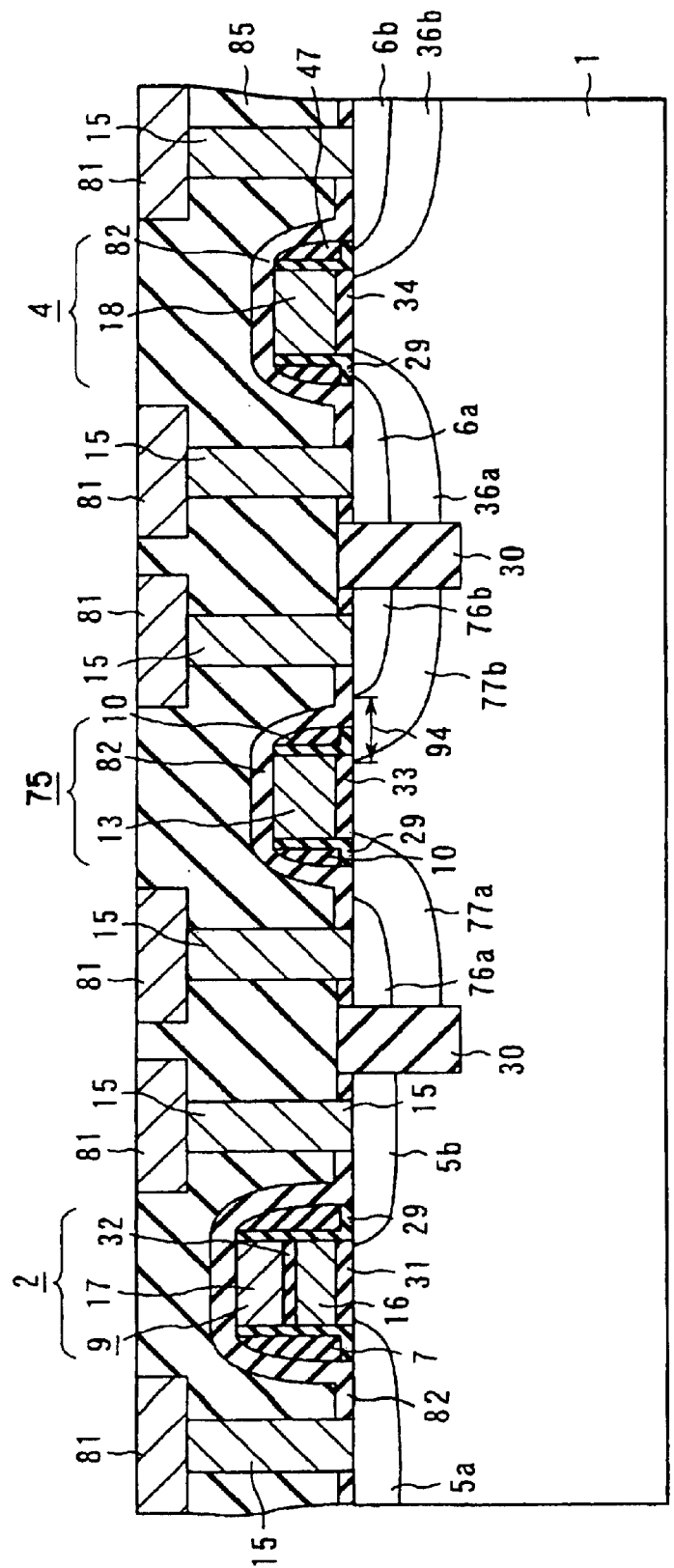
FIG. 13 is a cross sectional view showing the main construction of the semiconductor device according to a second embodiment of the present invention.

A semiconductor device according to a second embodiment of the present invention is shown in FIG. 13. The second embodiment is also directed to a NOR type flash memory like the first embodiment described previously. In the second embodiment, a thin silicon nitride film having a thickness of, for example, 80 nm is used to form the side wall 7 of the memory cell transistor 2 and the first side wall 10 of a high voltage PMOS transistor 75.

The N⁺ diffusion layers 6a, 6b of the high voltage NMOS transistor 4 are formed by implanting an N-type dopant over a thin first side wall 47. Since the implanted N-type dopant is thermally diffused from a position corresponding to the outside the first side wall 47, the N⁺ diffusion layers 6a, 6b are allowed to expand inside the channel.

On the other hand, the diffusion layers 5a, 5b having a high impurity concentration of the memory cell transistor 2 are formed by implanting ions of the dopant by the self-alignment using the gate electrode section 9. The dopant is further thermally diffused from the position corresponding to the gate edge, with the result that the diffusion layers 5a, 5b are allowed to extend inside the channel region.

The side wall 10 used in the high voltage PMOS transistor 75 is equal in construction and thickness to the side wall 7 of the memory cell transistor 2 and the side wall 47 of the NMOS transistor 4. The P⁺ diffusion layers 76a and 76b, which are formed by the ion implantation over the second side wall 82 and the third side wall (not shown) corresponding to the third side wall 19 shown in FIG. 8A, are allowed to extend wide into the outside relative to the gate electrode 13, compared with the N⁺ diffusion layers 6a, 6b of the high voltage NMOS transistor 4. In some cases, the P⁺ diffusion layers 76a, 76b are formed outside the second side wall 82.

On the other hand, the N⁻ diffusion layers 36a, 36b of the high voltage NMOS transistor 4 are formed after the processing of the gate electrode 18 by the ion implantation, which is performed by the self-alignment using the gate electrode 18 as a mask. It should be noted that the dopant is thermally diffused from the edge of the gate 18, with the result that the N⁻ diffusion layers 36a, 36b are allowed to extend into the channel region. On the other hand, the P⁻ diffusion layers 77a, 77b of the high voltage PMOS transistor 3 are formed by the ion implantation over the first side wall 10. In this case, the dopant is thermally diffused from the edge on the inner side of the first side wall 10 formed of a silicon nitride layer, with the result that the P⁻ diffusion layers 77a, 77b are allowed to extend into the channel region of the transistor 75.

Under the circumstances, the extension of the P⁻ diffusion layers 77a, 77b of the high voltage PMOS transistor 75 into the channel region below the gate electrode 13 is rendered smaller than that in the first embodiment. As a result, the LDD length 94 of the P⁻ diffusion layers 77a, 77b in the surface region of the substrate 1 is rendered shorter than the LDD length 14 in the high voltage PMOS transistor 75 in the first embodiment.

In other words, the effective channel length is further increased by the shortening of the LDD length 94, compared with the first embodiment, leading to improvements in the punch-through breakdown voltage and in the short channel effect. Alternatively, since it is possible to decrease the length of the gate electrode 13, it is possible to decrease the formation area of the transistor 75, compared with the conventional high voltage PMOS transistor. Incidentally, the construction of the high voltage NMOS transistor 4 is equal to that in the first embodiment.

The, manufacturing method of the nonvolatile semiconductor memory device according to the second embodiment of the present invention, which is constructed as shown in FIG. 13, will now be described in detail with reference to FIGS. 14 to 20B.

Figure 14:
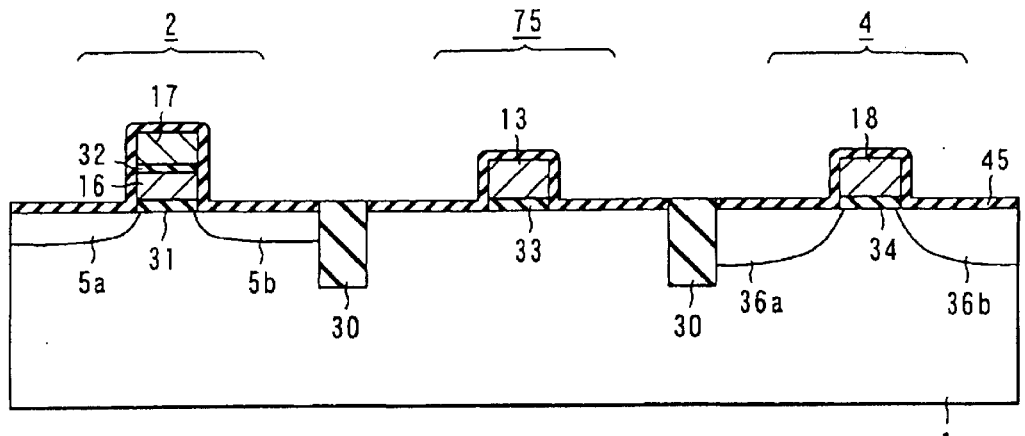
FIG. 14 is a cross sectional view showing one step of the manufacturing method of the main construction of the semiconductor device according to the second embodiment of the present invention.

In the first step, formed on the semiconductor substrate 1 are element isolating regions 30, a tunnel oxide film 31 of the memory cell transistor 2, the floating gate 16, the interlayer insulating film 32, an oxide film 33 of the high voltage PMOS transistor 75, an oxide film 34 of the high voltage NMOS transistor 4, the control gate electrode 17 of the memory cell transistor 2, the gate electrode 13 of the high voltage PMOS transistor 75, and the gate electrode 18 of the high voltage NMOS transistor 4, as shown in FIG. 14. Then, source/drain regions 5a, 5b, 36a, 36b for the memory cell transistor 2 and the high voltage NMOS transistor 4 are formed in a self-aligned fashion by means of an ion implantation relative to the gate electrodes 16, 17 and 18 and the subsequent diffusion of the implanted impurity ions, as shown in FIG. 14.

In the next step, a later oxide film 45 is formed in a thickness of about 10 nm to cover the surfaces of the gate electrodes 17, 13, 18 and the surface of the substrate 1 including the source/drain regions. Further, N⁻ diffusion layers 36a, 36b are formed as the source/drain regions of the high voltage NMOS transistor 4.

On the other hand, N⁺ diffusion layers 5a, 5b are formed in the source/drain regions of the memory cell transistor 2.

In forming these N⁺ diffusion layers 5a, 5b, a photoresist is formed such that the impurity ions are selectively implanted in only the desired regions.

Figure 15:
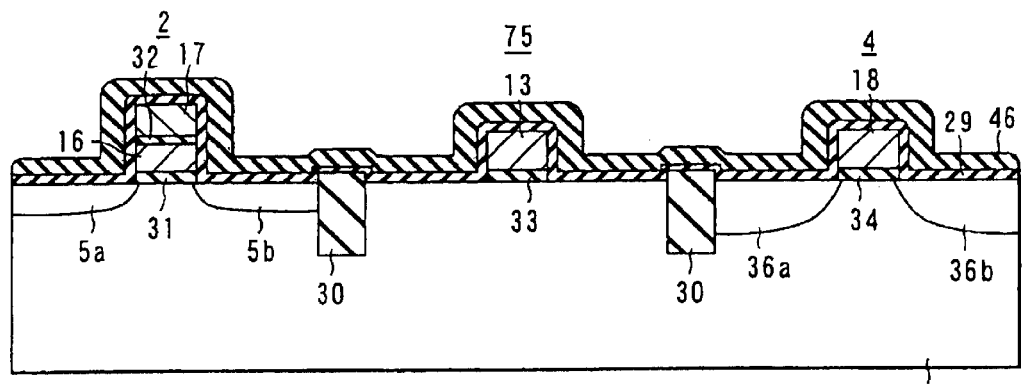
FIG. 15 is a cross sectional view showing one step, which follows the step shown in FIG. 14, of the manufacturing method of the main construction of the semiconductor device according to the second embodiment of the present invention.

In the next step, for example, a silicon oxide film 29 is deposited in a thickness of about 10 to 20 nm as a stopper of the side wall processing on the later oxide film 45, as shown in FIG. 15, followed by depositing, for example, a silicon nitride film 46 in a thickness of about 80 nm in order to form a first side wall 10. For the sake of simplicity, the gate later oxide film 45 is omitted and only the silicon oxide film 29 is shown in FIG. 15. Practically, a double layer structure formed of films 45 and 29 is formed.

Figure 16:
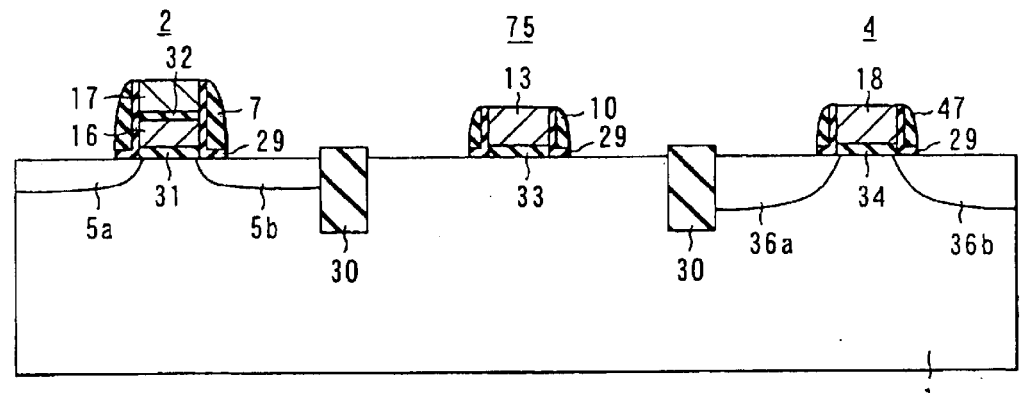
FIG. 16 is a cross sectional view showing one step, which follows the step shown in FIG. 15, of the manufacturing method of the main construction of the semiconductor device according to the second embodiment of the present invention.

In the next step, silicon nitride film 46 is selectively etched by an anisotropic etching so as to allow the silicon nitride film 46 to remain partly unremoved on the side surface of each of the gate electrodes, as shown in FIG. 16.

Further, a low concentration of a P-type dopant is implanted into the high voltage PMOS transistor 75 over the first side wall 10, as shown in FIG. 17. In this step, the memory cell transistor 2 and the NMOS transistor 4 are covered with a photoresist so as to prevent the P-type dopant from being implanted into areas of these transistors 2 and 4.

In the next step, a high concentration of an N-type dopant is implanted into the memory cell transistor 2 and the high voltage NMOS transistor 4 over the first side walls 7 and 47, respectively. In this step, the high voltage PMOS transistor 75 is covered with a photoresist so as to prevent the N-type dopant from being implanted into the transistor 75.

In the next step, a silicon nitride film 82 is deposited on the entire surface of the substrate 1 in a thickness of, for example, about 40 nm, as shown in FIG. 18. The silicon nitride film 82 acts as a stopper in the subsequent step of forming a contact hole for forming the contact plug 15 in the interlayer insulating film 85 and, at the same time, is used as a second side wall in the subsequent step of implanting a high concentration of P-type dopant.

Further, a silicon oxide film 12 for forming the third side wall is deposited on the entire surface of the silicon nitride film 82 in a thickness of about 50 nm.

Figure 19:
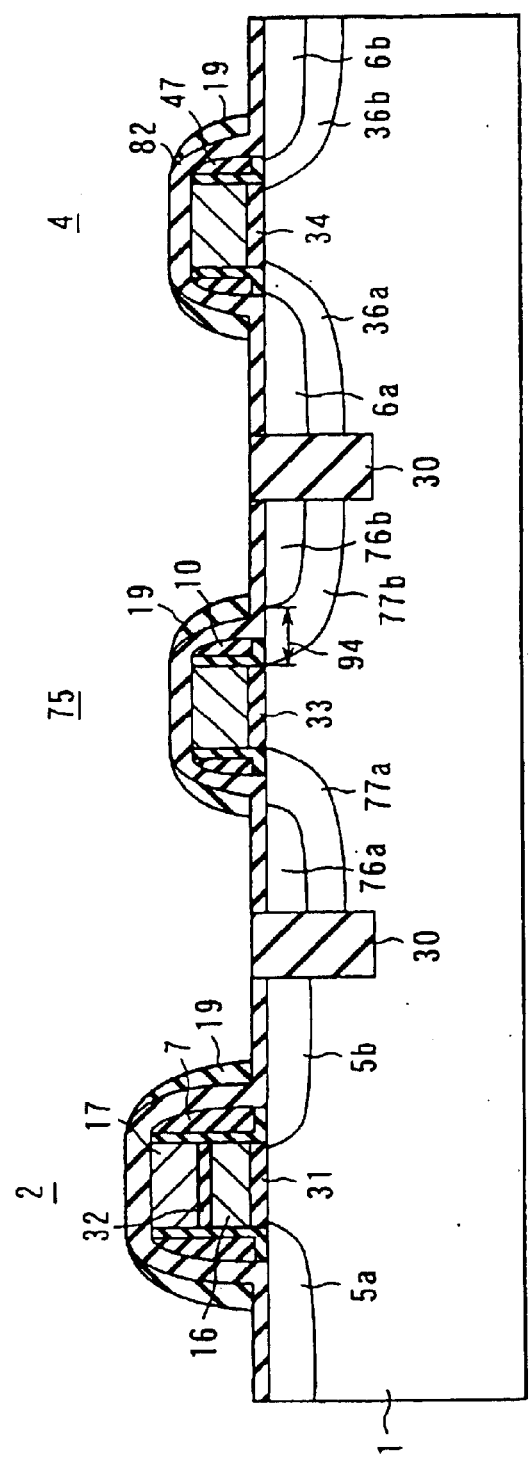
FIG. 19 is a cross sectional view showing one step, which follows the step shown in FIG. 18, of the manufacturing method of the main construction of the semiconductor device according to the second embodiment of the present invention.

In the next step, an anisotropic etching, which permits ensuring a selectivity ratio relative to the silicon nitride film 82, is applied to the entire silicon oxide film 12 so as to form partly the third side wall 19 of the silicon oxide film 12, as shown in FIG. 19. In this step, the sum in thickness of the silicon nitride film 82 and the third side wall 19 of the silicon oxide film 12 is set large enough to form the LDD length 94 of the diffusion layers 77a, 77b each having a low impurity concentration, the LDD length 94 being capable of imparting a sufficient junction breakdown withstand voltage to the high voltage PMOS transistor 75.

In the next step, the ion implantation for forming the P⁺ diffusion layers 76a, 76b is performed by using as a mask the third side wall 19 of the silicon oxide film 12 left partly on the side wall of the gate electrode 13. In this step, the memory cell transistor 2 and the NMOS transistor 4 are covered with a photoresist so as to prevent the P-type dopant from being implanted into these transistors 2 and 4.

In the next step, the third side wall 19 formed of a silicon oxide film on the silicon nitride film 82 is removed by etching with, for example, ammonium fluoride as shown in FIG. 20A. As a result, all the side walls of the gates of the memory cell transistor 2, the NMOS transistor 4 and the PMOS transistor 75 are formed of silicon nitride and have substantially the same thickness.

Further, the entire surface of the substrate 1 is covered with the interlayer insulating film 85 by, for example, the CVD method, followed by forming contact holes in the interlayer insulating film 85 and subsequently burying a conductive material such as tungsten in the contact holes so as to form the contact plugs 15 and connecting desired wiring electrodes 81 to the contact plugs 15, thereby obtaining a NOR type flash memory as shown in FIG. 13.

Incidentally, the low voltage PMOS transistor and the low voltage NMOS transistor are formed by the method similar to that employed in the first embodiment and, thus, the detail description of the manufacturing process is omitted here. Structures of the low voltage PMOS transistor and the low voltage NMOS transistor correspond to step of FIG. 20A are shown in FIG. 20B.

According to the second embodiment of the present invention, in the PMOS transistor 75 in which the side wall is of a triple layer structure during the manufacturing process, the LDD length 94 of the P⁻ diffusion layers 77a, 77b is longer than that of the high voltage NMOS transistor 4. On the other hand, the distance between the gate 9 of the memory cell transistor 2 and the contact plug 15 is rendered shorter because the side wall of the memory cell 2 is rendered thinner than that in the prior art so as to make it possible to diminish the memory cell area. It should also be noted that the portions of the N⁻ diffusion layers 36a, 36b of the high voltage NMOS transistor 4 can be made shorter than those in the prior art because of the sum of the thin side walls 47 and 82 so as to make it possible to suppress the parasitic resistance and to prevent the current driving capability from being lowered.

It should also be noted that the effective channel length of the high voltage PMOS transistor 75 is rendered larger than that in the prior art so as to improve the punch through breakdown voltage and the short channel effect, compared with the prior art. Alternatively, since it is possible to diminish the length of the gate electrode 13 in the channel direction, it is possible to diminish the area, compared with the conventional high voltage PMOS transistor.

Also, the second embodiment of the present invention produces the effects similar to those produced by the first embodiment. Specifically, the addition of the lithography process is not required, compared with the conventional technology, with the result that the increase in the number of process steps is suppressed to only the steps for the deposition of the silicon oxide film and the selective etching of the silicon oxide film to permit the silicon oxide film to remain only on the side wall of the gate. It follows that the increase in the number of process steps is limited to the minimum level, compared with the prior art producing the similar effect.

Incidentally, the modification of the first embodiment can be applied as it is to the second embodiment described above.

Each of the embodiments described above is directed to a nonvolatile semiconductor memory device. However, the technical idea of the present invention can also be applied to other semiconductor devices including a high voltage transistor such as a logic LSI and a memory-mounted logic LSI.

According to the embodiments of the present invention, it is possible to maintain the junction breakdown withstand voltage of the high voltage PMOS transistor and to decrease the distance between the contact plug and the gate electrode in the NMOS transistor and the memory cell transistor so as to decrease the pattern size.

It is also possible to suppress the short channel effect of the high voltage PMOS transistor so as to increase the channel length.

Further, it is possible to manufacture a semiconductor device provided with a double side wall by adding a lithography process, compared with the other double side wall process.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    forming a gate of a first transistor and a gate of a second transistor on a semiconductor substrate;
    forming a first diffusion layer of a second conductivity type having a low impurity concentration in said semiconductor substrate with the gate of said first transistor used as a mask;
    forming a second diffusion layer of a first conductivity type having a low impurity concentration in said semiconductor substrate with the gate of said second transistor used as a mask;
    forming gate side walls of the same thickness to surround the gates of said first transistor and said second transistor, respectively;
    forming a first diffusion layer of a second conductivity type having a high impurity concentration, which is positioned adjacent to said first diffusion layer having a low impurity concentration, within said semiconductor substrate, with the gate side wall of said first transistor used as a mask;
    depositing a second side wall material and a mask side wall material differing from the second side wall material over said first side walls and gates of the transistors;
    forming a mask side wall on the side surface of the gate side wall of said second transistor through a second side wall by selectively etching said third side wall material by means of an anisotropic etching using said second side wall material as an etching stopper;
    forming a second diffusion layer of the first conductivity type having a high impurity concentration, which is positioned adjacent to said second diffusion layer having a low impurity concentration, within said semiconductor substrate, with the mask side wall used as a mask; and
    removing said mask side wall.

2. The method of manufacturing a semiconductor device according to claim 1, wherein said first diffusion layer having a low impurity concentration is an N-type diffusion layer having a low impurity concentration, said first diffusion layer having a high impurity concentration is an N-type diffusion layer having a high impurity concentration, said first transistor is an N-type transistor, said second diffusion layer having a low impurity concentration is a P-type diffusion layer having a low impurity concentration, said second diffusion layer having a low impurity concentration is a P-type diffusion layer having a high impurity concentration, and said second transistor is a P-type transistor.

3. The method of manufacturing a semiconductor device according to claim 1, further comprising:
    forming a gate of a memory cell transistor on said semiconductor substrate;
    forming a third diffusion layer of the second conductivity type having a high impurity concentration within said semiconductor substrate around said gate of the memory cell transistor; and
    forming a gate side wall of said memory cell transistor substantially equal in thickness to said gate side walls of said first transistor and said second transistor.

4. The method of manufacturing a semiconductor device according to claim 3, wherein forming said gate of the memory cell transistor further comprising:
    forming a floating gate acting as a charge accumulating layer;
    forming a control gate positioned above said floating gate; and
    forming an insulating layer interposed between said floating gate and said control gate.

5. The method of manufacturing a semiconductor device according to claim 3, wherein said memory cell transistor is a nonvolatile memory device, said first transistor is an N-type MOS transistor having a first LDD structure, and said second transistor is a P-type MOS transistor having a second LDD structure, said second LDD structure being longer than said first LDD structure.

6. The method of manufacturing a semiconductor device according to claim 1,
    wherein said second transistor is a high voltage PMOS transitor and said first transistor is a high voltage NMOS transistor;
    and wherein forming said second diffusion layer having a low impurity concentration is carried out after forming the gate side walls of said gate of the first transistor and said gate of the second transistor.

7. A method of manufacturing a semiconductor device, comprising:
    forming a first gate insulating film for a high voltage transistor on a semiconductor substrate;
    forming a second gate insulating film for a low voltage transistor on the semiconductor substrate, said second gate insulating film being thinner than said first gate insulating film;
    forming a gate of a first high voltage transistor and a gate of a second high voltage transistor on said first gate insulating film by stacking conductive materials to form a stacked gate structure followed by selectively patterning the stacked gate structure;
    forming a gate of a first low voltage transistor and a gate of a second low voltage transistor on said second gate insulating film by depositing a conductive material followed by selectively patterning the conductive material;
    introducing an impurity of a first conductivity type with a low concentration into the semiconductor substrate using gates of said second high voltage transistor and said second low voltage transistor as masks, and introducing an impurity of a second conductivity type with a low concentration into the semiconductor substrate using gates of said first high voltage transistor and said first low voltage transistor as masks;
    depositing a first side wall material over the gates of the transistors;
    forming a first side wall on side surfaces of said gates of the transistors by selectively etching said first side wall material by means of an anisotropic etching;
    introducing an impurity of the second conductivity type with a high concentration into the semiconductor substrate using said side walls of said first high voltage transistor and said first low voltage transistor as masks;

depositing a second side wall material and a third side wall material differing from said second side wall material over said first side walls and gates of the transistors;

forming a third side wall on the side surface of said second side wall by selectively etching said third side wall material by means of an anisotropic etching using the second side wall material as an etching stopper;

introducing an impurity of said first conductivity type with a high concentration into the semiconductor substrate using said third side walls of said second high voltage transistor and said second low voltage transistor as masks;

depositing an interlayer insulating film on the entire surface of said semiconductor substrate; and selectively forming contact holes in said interlayer insulating film.

8. A method of manufacturing a semiconductor device, comprising:

forming an element isolating region in a semiconductor substrate;

forming a tunnel oxide film for a memory cell, a floating gate material and an inter-electrode insulating film;

forming a first gate insulating film for a high voltage transistor on said semiconductor substrate;

forming a second gate insulating film for a low voltage transistor on said semiconductor substrate, said second gate insulating film being thinner than said first gate insulating film;

forming a gate of the memory cell by depositing a conductive material for a control gate followed by selectively patterning successively said control gate material, said inter-electrode insulating film, and said floating gate material;

selectively patterning a conductive material to form a gate gate of a first high voltage transistor and a gate of a second high voltage transistor on said first gate insulating film, and to form a gate of a first low voltage transistor and a gate of a second low voltage transistor on said second gate insulating film;

introducing an impurity of a second conductivity type with a high concentration into the semiconductor substrate using the gate of the memory cell, introducing an impurity of the second conductivity type with a low concentration into the semiconductor substrate using the gates of said first high voltage transistor and said first low voltage transistor as masks, and introducing an impurity of a first conductivity type with a low concentration into the semiconductor substrate using gates of said second high voltage transistor and said second low voltage transistor as masks;

depositing a first side wall material over the gates of the transistors;

forming a first side wall on side surfaces of gates of transistors by selectively etching the first side wall material by an anisotropic etching;

introducing an impurity of the second conductivity type with a high concentration into the semiconductor substrate using said first side walls of said first high voltage transistor and said first low voltage transistor as masks;

depositing a second side wall material and a third side wall material differing from said second side wall material over said first side walls and gates of the transistors;

forming a third side wall on the side surface of said second side wall by selectively etching said third side wall material by an anisotropic etching using the second side wall material as an etching stopper;

introducing an impurity of the first conductivity type with a high concentration into said semiconductor substrate using said third side walls of said second high voltage transistor and said second low voltage transistor as masks;

removing said third side wall;

depositing an interlayer insulating film on the entire surface of said semiconductor substrate;

selectively forming contact holes in said interlayer insulating film;

forming a metal wiring; and forming an insulating film on said metal wiring.

9. A method of manufacturing a semiconductor device, comprising:

forming an element isolating region in a semiconductor substrate;

forming a first gate insulating film for a high voltage transistor on said semiconductor substrate;

forming a second gate insulating film for a low voltage transistor on the semiconductor substrate, said second gate insulating film being thinner than said first gate insulating film;

forming gates of first and second high voltage transistors on said first pate insulating film and gates of first and second low voltage transistor on said second gate insulating film by stacking a conductive material layer followed by patterning said conductive material layer by an etching;

introducing an impurity of a second conductivity type with a low conductive into the semiconductor substrate using gates of said first high voltage transistor and said first low voltage transistor as masks;

depositing a first side wall material over the gates of the transistors;

forming a first side wall on side surfaces of said gates of the transistors by selectively etching said first side wall material by an anisotropic etching;

introducing an impurity of a first conductivity type with a low concentration into the semiconductor substrate with said first side walls of the gates of said second high voltage transistor and said second low voltage transistor using as masks;

introducing an impurity of the second conductivity type with a high concentration into the semiconductor substrate using said side walls of said first high voltage transistor and said first low voltage transistor as masks;

depositing a second side wall material and a third side wall material differing from said second side wall material over said first side walls and gates of the transistors;

forming a third side wall on the side surface of said second side wall material by selectively etching said third side wall material by an anisotropic etching using the second side wall material as an etching stopper;

introducing an impurity of the first conductivity type with a high concentration into the semiconductor substrate that in the impurity diffusion layer of the first conductivity type using said third side walls of said second high voltage transistor and said second low voltage transistor as masks;

removing the third side wall;

depositing an interlayer insulating film on the entire substrate; and selectively forming contact holes in said interlayer insulating film.

10. The method of manufacturing a semiconductor device according to claim 9, further comprising:

forming on said semiconductor substrate an element isolating region;

forming a tunnel oxide film, a floating gate electrode, an inter-electrode insulating film, and a control gate electrode to form a gate electrode of a memory cell;

introducing an impurity of the second conductivity type with a high concentration into the semiconductor substrate using the gate of the memory cell;

forming at least a single layer of a metal wiring on said contact hole; and forming an insulating film on said metal wiring.

11. A method of manufacturing a semiconductor device, comprising:

introducing an impurity of a first conductivity type into a semiconductor substrate;

forming a tunnel oxide film and a floating gate material in a memory cell region on the semiconductor substrate;

forming a first gate insulating film for a high voltage transistor in a part of a peripheral circuit region on the semiconductor substrate;

forming a second gate insulating film for a low voltage transistor in another part of the peripheral circuit region on the semiconductor substrate, said second gate insulating film being thinner than said first gate insulating film;

forming an inter-electrode insulating film on the floating gate material;

forming a gate of a memory cell by depositing conductive material for a control gate followed by selectively patterning the control gate material, said inter-electrode insulating film, and said floating gate material successively;

selectively patterning a conductive material to form a gate of a first high voltage transistor and a gate of a second high voltage transistor on said first gate insulating film and a gate of a first low voltage transistor and a gate of a second low voltage transistor on said second gate insulating film in a peripheral circuit region;

introducing an impurity of a second conductivity type with a high concentration into the semiconductor substrate using the gate of the memory cell, and introducing the impurity of the second conductivity type into the semiconductor substrate using the gates of said first high voltage transistor and said first low voltage transistor as masks;

depositing a first side wall material over the gates of the transistors;

forming a first side wall on side surface of said gates of transistors by selectively etching said first side wall material by an anisotropic etching;

introducing an impurity of a first conductivity type with a low concentration into the semiconductor substrate using said first side walls of the gates of said second high voltage transistor and said second low voltage transistor as masks;

introducing an impurity of the second conductivity type with a high concentration into the semiconductor substrate using said side walls of said first high voltage transistor and said first low voltage transistor as masks;

depositing a second side wall material and a third side wall material differing from said second side wall material over said first side walls and gates of the transistors;

forming a third side wall on the side surface of the second side wall material by selectively etching said third side wall material by an anisotropic etching using the second side wall material as an etching stopper;

introducing an impurity of the first conductivity type with a high concentration into the semiconductor substrate using said third side walls of said second high voltage transistor and said second low voltage transistor as masks;

removing said third side wall;

depositing an interlayer insulating film on the entire surface of the substrate;

selectively forming contact holes in said interlayer insulating film;

forming at least a single metal wiring; and forming an insulating film on said metal wiring.

* * * * *